(12) United States Patent
Aleksov et al.

(10) Patent No.: US 11,837,534 B2
(45) Date of Patent: Dec. 5, 2023

(54) SUBSTRATE WITH VARIABLE HEIGHT CONDUCTIVE AND DIELECTRIC ELEMENTS

(71) Applicant: Intel Corporation, Santa Clara, CA (US)

(72) Inventors: Aleksandar Aleksov, Chandler, AZ (US); Kristof Darmawikarta, Chandler, AZ (US); Haobo Chen, Gilbert, AZ (US); Changhua Liu, Chandler, AZ (US); Sri Ranga Sai Boyapati, Chandler, AZ (US); Bai Nie, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/859,309

(22) Filed: Dec. 29, 2017

(65) Prior Publication Data

US 2019/0206781 A1  Jul. 4, 2019

(51) Int. Cl.
*H01L 23/498* (2006.01)
*H01L 21/48* (2006.01)

(52) U.S. Cl.
CPC .... *H01L 23/49838* (2013.01); *H01L 21/4857* (2013.01); *H01L 23/49822* (2013.01)

(58) Field of Classification Search
CPC ............. H01L 23/5226; H01L 27/0207; H01L 23/528; H01L 23/5283; H01L 21/823431; H01L 2924/00014; H01L 25/50; H01L 2924/00; H01L 2924/15311; H01L 25/0657
See application file for complete search history.

(56) References Cited

U.S. PATENT DOCUMENTS

| | | | | |
|---|---|---|---|---|
| 8,766,345 | B2 * | 7/2014 | Farmer | .................. H01L 28/90 257/303 |
| 8,921,975 | B2 * | 12/2014 | Anderson | ........... H01L 23/5256 257/529 |
| 9,991,200 | B2 * | 6/2018 | Ting | .................... H01L 23/5226 |
| 2001/0041308 | A1 | 11/2001 | Bhatt et al. | |
| 2008/0230263 | A1 | 9/2008 | En | |

(Continued)

OTHER PUBLICATIONS

Office Action from German Patent Application No. 102018129825.0, dated Apr. 26, 2021, 9 pgs.

(Continued)

*Primary Examiner* — Tony Tran
(74) *Attorney, Agent, or Firm* — Schwabe, Williamson & Wyatt, P.C.

(57) ABSTRACT

Apparatuses, systems and methods associated with package substrate design with variable height conductive elements within a single layer are disclosed herein. In embodiments, a substrate may include a first layer, wherein a trench is located in the first layer, and a second layer located on a surface of the first layer. The substrate may further include a first conductive element located in a first portion of the second layer adjacent to the trench, wherein the first conductive element extends to fill the trench, and a second conductive element located in a second portion of the second layer, wherein the second conductive element is located on the surface of the first layer. Other embodiments may be described and/or claimed.

7 Claims, 13 Drawing Sheets

(56) References Cited

U.S. PATENT DOCUMENTS

2010/0044083 A1     2/2010   Fan et al.
2013/0323930 A1*   12/2013   Chattopadhyay ............................ H01L 21/02107
                                                                                                                                                                        438/703
2015/0348931 A1     12/2015   Lee et al.

OTHER PUBLICATIONS

Office Action from German Patent Application No. 102018129825.0, dated Feb. 4, 2022, 3 pgs.
Notice of Allowance from German Patent Application No. 102018129825.0, dated Apr. 11, 2022, 32 pgs.

* cited by examiner

SUBSTRATE WITH VARIABLE HEIGHT CONDUCTIVE AND DIELECTRIC ELEMENTS

TECHNICAL FIELD

The present disclosure relates to the field of electronic components. More particularly, the present disclosure relates to package substrate design with variable height conductive elements within a single layer.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

In legacy process flows (such as semi-additive processes) for generation of substrates, traces within a single layer are limited to all being of the same thickness. Further, the thickness of the traces may be limited to a maximum thickness due to the risk of delamination of a photo-resist utilized in the process flows. However, power delivery within substrates benefits from thicker traces to reduce voltage drop between two nodes, while signal integrity benefits from thinner traces for impedance matching. To address these benefits, legacy substrate architecture design would have the layer include thick traces to reduce voltage drop and have long, thick (relative to embodiments with thinner traces) signal-carrying traces to match impedance. This legacy design sacrifices signal routing density, thereby surrendering valuable substrate space.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
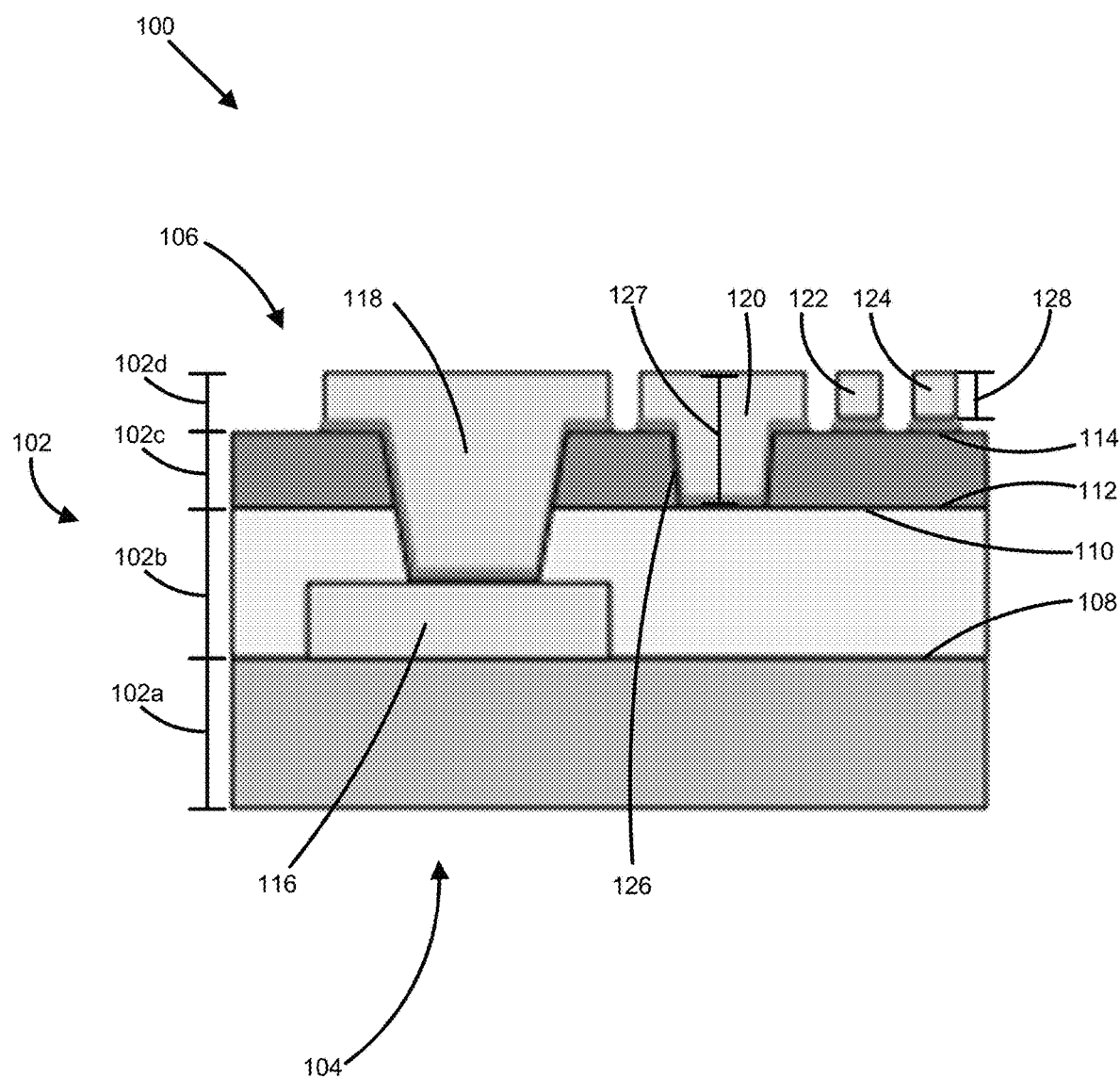
FIG. 1 illustrates a cross-sectional view of an example substrate with variable height conductive elements, according to various embodiments.

Apparatuses, systems and methods associated with package substrate design with variable height conductive elements within a single layer are disclosed herein. In embodiments, a substrate may include a first layer, wherein a trench is located in the first layer, and a second layer located on a surface of the first layer. The substrate may further include a first conductive element located in a first portion of the second layer adjacent to the trench, wherein the first conductive element extends to fill the trench, and a second conductive element located in a second portion of the second layer, wherein the second conductive element is located on the surface of the first layer.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 illustrates a cross-sectional view of an example substrate 100 with variable height conductive elements, according to various embodiments. The substrate 100 may include one or more layers 102. In the illustrated embodiment, the substrate 100 includes a first layer 102a, a second layer 102b, a third layer 102c, and a fourth layer 102d. The second layer 102b may be located on a surface on the first layer 102a, the third layer 102c may be located on a surface of the second layer 102b, and the fourth layer 102d may be located on a surface of the third layer 102c. In particular, the first layer 102a may be located at a first side 104 of the substrate 100 and the fourth layer 102d may be located at a second side 106 of the substrate 100, the second side 106 being opposite to the first side 104. The second layer 102b and the third layer 102c may be located between the first layer 102a and the fourth layer 102d. The second layer 102b may abut the first layer 102a on a first side 108 of the second layer 102b and may abut the third layer 102c on a second side 110 of the second layer 102b, wherein the second side 110 is opposite to the first side 108. The third layer 102c may abut the second layer 102b on a first side 112 of the third layer 102c and may abut the fourth layer 102d on a second side 114 of the third layer 102c, wherein the second side 114 is opposite to the first side 112.

The first layer 102a may include an organic dielectric material. For example, the first layer 102a may include an epoxy-based dielectric material. In some embodiments, the first layer 102a may further include silicon fillers. The third layer 102c may include a photo-imageable dielectric (PID) material. For example, the third layer 102c may be a polyimide-based dielectric material, which may include hydrogen, nitrogen, carbon, oxygen, or some combination thereof. Further, the third layer 102c may comprise polyimide or epoxy, or may be benzocyclobutene-based, epoxides with photoactive molecules, acrylic matrices, or some combination thereof, in some embodiments. In some embodiments, the third layer 102c may further include silicon fillers.

The second layer 102b may include an organic dielectric material, such as the first layer 102a, in some embodiments, and may include a PID material, such as the third layer 102c, in other embodiments. In particular, the second layer 102b may include an organic dielectric material in embodiments related to the procedure 1800 of FIG. 18. In these embodiments, the second layer 102b may include an epoxy-based dielectric material. In some of these embodiments, the second layer 102b may further include silicon fillers.

Figure 9:
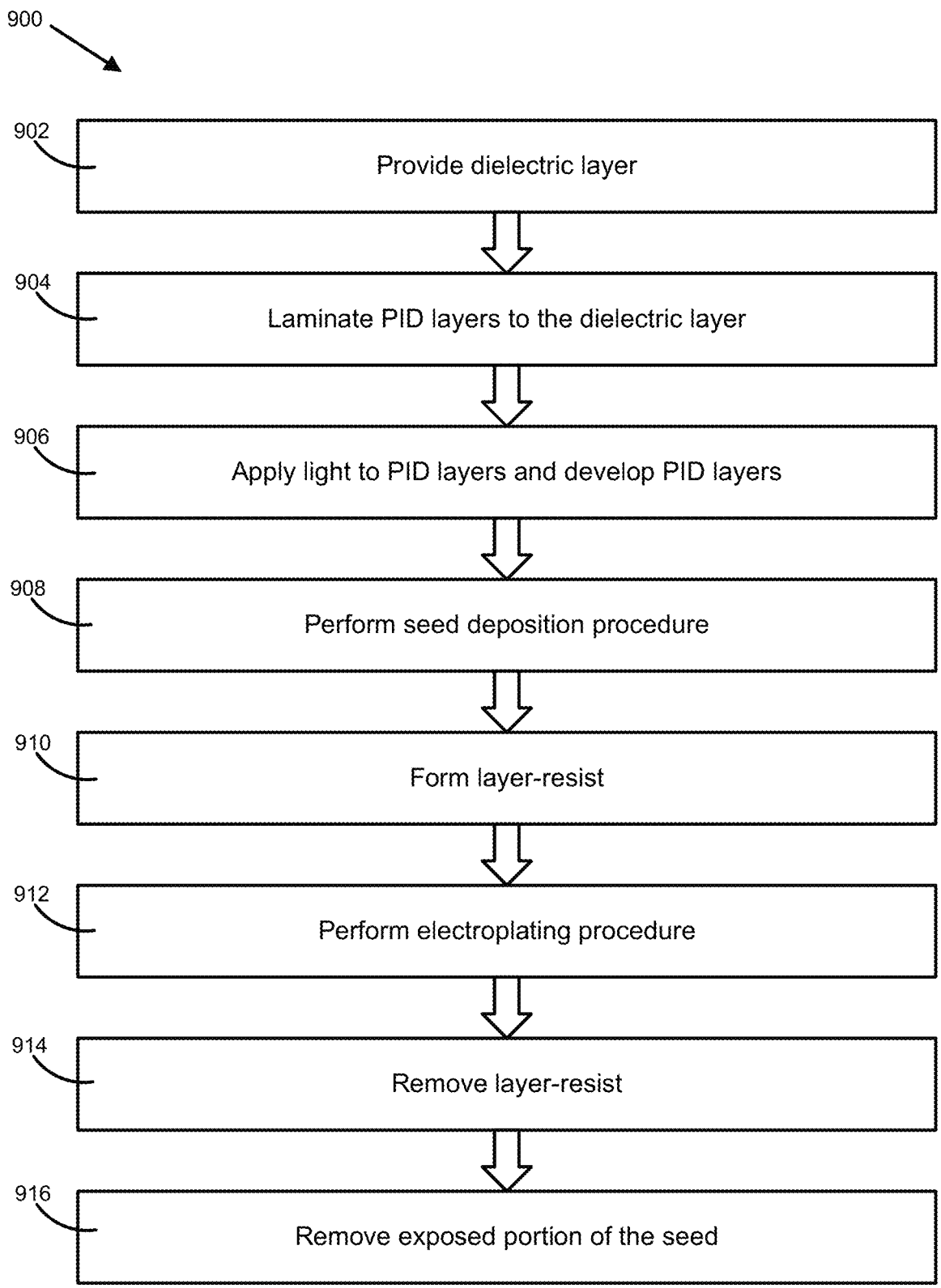
FIG. 9 illustrates an example procedure for producing a substrate, according to various embodiments.

The second layer 102b may include a PID material in embodiments related to the procedure 900 of FIG. 9. In these embodiments, the second layer 102b may be a polyimide-based dielectric material, which may include hydrogen, nitrogen, carbon, oxygen, or some combination thereof. In some of these embodiments, the second layer 102b may further include silicon fillers. In these embodiments, the silicon fillers within the PID material of the second layer 102b may have a lower concentration than the silicon filler within the organic dielectric material of the first layer 102a. For example, the silicon filler within the PID material may have a concentration of between 20% and 25% per volume, while the silicon fillers within the organic dielectric material may have a concentration of at least 50% per volume.

In embodiments where both the second layer 102b and the third layer 102c include PID material, the PID material of the second layer 102b may be more sensitive to light than the PID material of the third layer 102c. In particular, the PID material of the second layer 102b may be cured by a lower dose of light than the PID material of the third layer 102c. For example, the PID material of the second layer 102b may cure at approximately (within 10 millijoules (mJ) per square centimeter ($cm^2$)) 40 mJ per $cm^2$ while the PID material of the third layer 102c may cure at approximately (within 10 mJ per $cm^2$) 200 mJ per $cm^2$ in some embodiments. Further, the PID material of the second layer 102b may cure between 40 and 200 mJ per $cm^2$ while the PID material of the third layer 102c may cure between 500 mJ per $cm^2$ in other embodiments.

The fourth layer 102d may include one or more conductive elements (such as traces), or portions thereof. In the illustrated embodiment, the fourth layer 102d includes air located between the portions of the conductive elements located in the fourth layer 102d. In other embodiments, dielectric material may be located between the portions of the conductive elements located in the fourth layer 102d. The dielectric material may include an epoxy-based dielectric material, which may include silicon fillers in some embodiments.

The substrate 100 may include one or more pads. In the illustrated embodiment, the substrate 100 includes a pad 116. The pad 116 may include a conductive material, such as copper, silver, gold, aluminum, platinum, iron, or some combination thereof. The pad 116 may be utilized for conducting electricity between other conductive elements (such as traces, vias, other pads, and/or other similar conductive elements).

The pad 116 may be located at the first side 108 of the second layer 102b. Further, the pad 116 may be located between the first side 108 of the second layer 102b and the second side 110 of the second layer 102b. In some embodiments, the pad 116 may extend only partially through the second layer 102b, such that the pad 116 does not extend to the second side 110 of the second layer 102b.

The substrate 100 may include one or more conductive elements. For example, the substrate 100 includes a first conductive element 118, a second conductive element 120, a third conductive element 122, and a fourth conductive element 124. The conductive elements may include a conductive material, such as copper, silver, gold, aluminum, platinum, iron, or some combination thereof. The conductive elements may be utilized for conducting electricity.

The first conductive element 118 may be a via. In particular, the first conductive element 118 may be utilized to conduct electricity between elements located in different layers of the substrate 100. The first conductive element 118 may have a first portion located within the fourth layer 102d, may extend through the third layer 102c, and may have a second portion located within the second layer 102b. The second portion of the first conductive element 118 may extend through a portion of the second layer 102b to the pad 116 and may couple the first conductive element 118 to the pad 116. In some embodiments, the first conductive element 118 may conduct electricity between the pad 116 and an element located in the fourth layer 102d and/or adjacent to the fourth layer 102d.

The second conductive element 120 may be a trace. In particular, the second conductive element 118 may be utilized to conduct electricity between elements located within a same layer of the substrate 100. The second conductive element 120 may have a portion located within the fourth layer 102d. The third layer 102c may include a trench 126 located between the PID material in the third layer 102c. The trench 126 may extend within the third layer between the PID material. The trench 126 may extend from the second side 114 of the third layer 102c to the first side 112 of the third layer 102c. The second conductive element 120 may be located adjacent to the trench 126, and may extend into the trench 126 and fill the trench 126.

The third conductive element 122 and the fourth conductive element 124 may also be traces. The third conductive element 122 and the fourth conductive element 124 may be located within the fourth layer 102d and may be located on a surface of the second side 114 of the third layer 102c.

The second conductive element 120 may have a first thickness 127. The third conductive element 122 and the fourth conductive element 124 may each have a second thickness 128, wherein the first thickness 127 is greater than the second thickness 128. The first thickness 127 and the second thickness 128 may be measured in a direction perpendicular to the extension of the layers 102. The first thickness 127 of the second conductive element 120 may be greater than the second thickness 128 of the third conducive element 122 and the fourth conductive element 124 due to the second conductive element 120 filling the trench 126.

Further, thicknesses of dielectric material (which may comprise the PID material and/or the dielectric material of the first layer 102a, the second layer 102b, and the third layer 102c) corresponding to the second conductive element 120, the third conductive element 122, and the fourth conductive element 124 may differ. For example, the thickness of the dielectric material between the second conductive element 120 and the first side 104 of the substrate 100 may comprise a third thickness 130. The thickness of the dielectric material between the third conductive element 122 and the first side 104 of the substrate 100 may comprise a fourth thickness 132, wherein the fourth thickness is greater than the third thickness 130. Further, the thickness of the dielectric material between the fourth conductive element 124 and the first side 104 of the substrate 100 may comprise the fourth thickness 132.

Due to the second conductive element 120 having the first thickness 127, which is greater than the second thickness 128, the second conductive element 120 may provide less voltage drop than each of the third conductive element 122 and the fourth conductive element 124. Based on the reduced voltage drop, the second conductive element 120 may be suitable for power delivery within the substrate 100. Further, due to the third conductive element 122 and the fourth conductive element 124 being the second thickness 128, which is thinner than the first thickness 127, the third conductive element 122 and the fourth conductive element 124 may provide for impedance matching for signal integrity without having to utilize indirect routing between two elements to increase the impedance of the third conductive element 122 and the fourth conductive element 124. Accordingly, the third conductive element 122 and the fourth conductive element 124 may be utilized for conducting signals. Therefore, the substrate 100 may include power delivery traces and signal-carry traces in the fourth layer 102d without having to surrender valuable substrate space.

Figure 2:
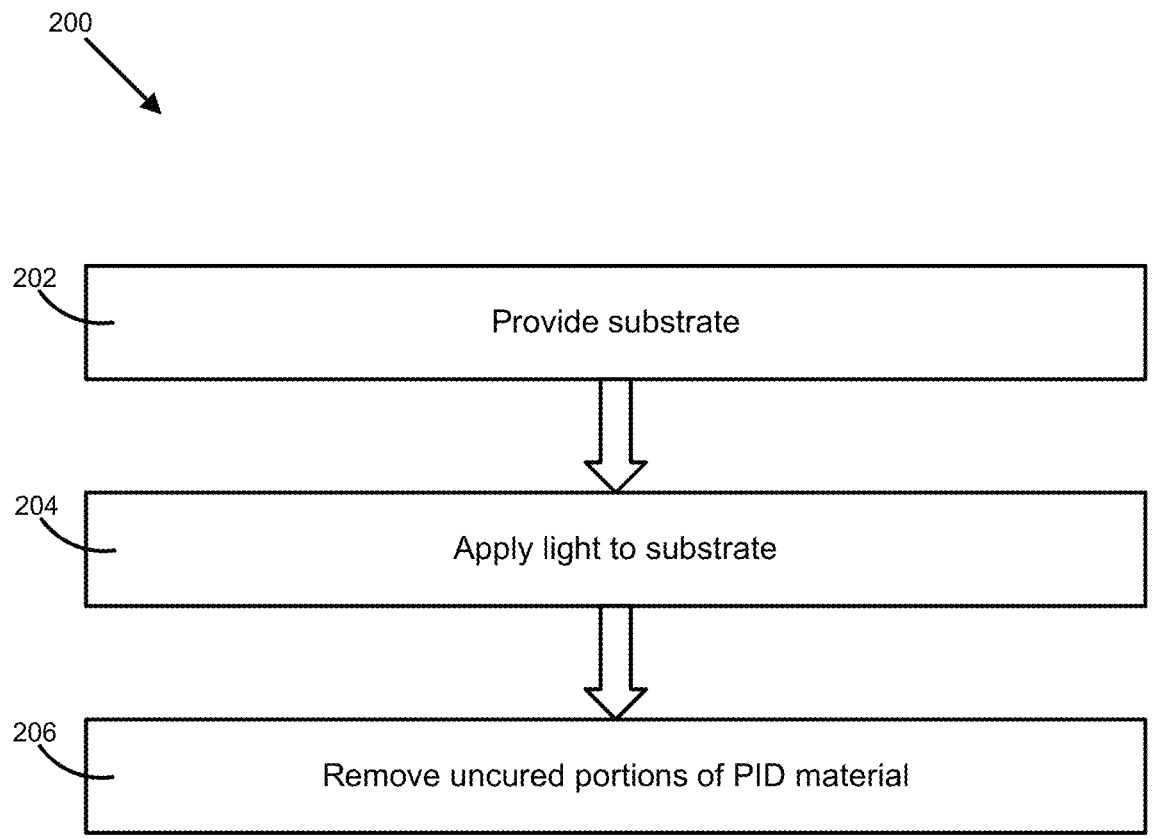
FIG. 2 illustrates an example procedure for photo-imageable dielectric (PID) feature formation, according to various embodiments.

FIG. 2 illustrates an example procedure 200 for PID feature formation, according to various embodiments. In particular, the procedure 200 may produce via recesses (such as for the first conductive element 118 (FIG. 1) when the first conductive element is a via) and/or trenches (such as the trench 126 (FIG. 1)) in a substrate (such as the substrate 100). The embodiment described herein includes a PID material that may comprise a negative tone PID material (where the PID material becomes cross-linked and/or polymerized in response to the application of light). In other embodiments, the PID material may comprise a positive tone PID material (where the PID becomes more soluble in response to the application of light). In the positive tone PID material embodiments, the portions of the PID material to which the light is applied and to which the light does not contact may be swapped from the description of the negative tone PID below.

In stage 202, a substrate may be provided. Providing the substrate may include acquiring a substrate having at least one layer that includes an organic dielectric material (such as the first layer 102a (FIG. 1)) and at least one layer that includes a PID material (such as the third layer 102c (FIG. 1)). In other embodiments, providing the substrate may include forming the substrate by laminating at least one layer that includes a PID material to at least one layer that includes an organic dielectric material.

Figure 3:
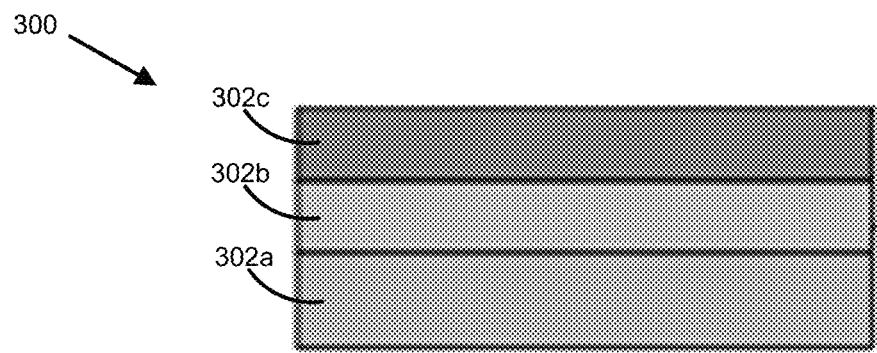
FIG. 3 illustrates a cross-sectional view of an example substrate that may be provided in accordance with stage 202.

FIG. 3 illustrates a cross-sectional view of an example substrate 300 that may be provided in accordance with stage 202. The substrate 300 may include a first layer 302a, a second layer 302b, and third layer 302c. The first layer 302a may include an organic dielectric material. For example, the first layer 302a may include an epoxy-based dielectric material. In some embodiments, the first layer 302a may further include silicon fillers.

The second layer 302b may include a first PID material. For example, the second layer 302b may be a polyimide-based dielectric material, which may include hydrogen, nitrogen, carbon, oxygen, or some combination thereof. In some embodiments, the second layer 302b may further include silicon fillers.

The third layer 302c may include a second PID material. For example, the third layer 302c may be a polyimide-based dielectric material, which may include hydrogen, nitrogen, carbon, oxygen, or some combination thereof. In some embodiments, the third layer 302c may further include silicon fillers. The first PID material may be more sensitive to light than the second PID material. In particular, the first PID material may be cured by a lower dose of light than the second PID material.

Figure 6:
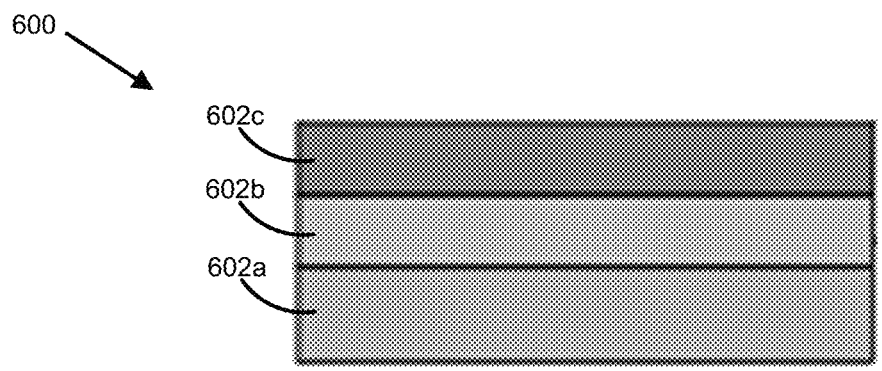
FIG. 6 illustrates another example substrate that may be provided in accordance with stage 202.

FIG. 6 illustrates another example substrate 600 that may be provided in accordance with stage 202. The substrate 600 may include a first layer 602a, a second layer 602b, and third layer 602c. The first layer 602a and the second layer 602b may both include an organic dielectric material. For example, the first layer 602a and the second layer 602b may include an epoxy-based dielectric material. In some embodiments, the first layer 602a and/or the second layer 602b may further include silicon fillers.

The third layer 602c may include a PID material. For example, the third layer 602c may be a polyimide-based dielectric material, which may include hydrogen, nitrogen, carbon, oxygen, or some combination thereof. In some embodiments, the third layer 602c may further include silicon fillers.

In stage 204, light may be applied to the substrate. In some embodiments, the light applied to the substrate may have a wavelength of approximately (within 10 nanometers (nm)) 365 nm. The light may be applied to a surface of the substrate at which a layer that includes a PID material is located. Applying the light to the substrate may include applying light to only portions of the substrate, applying different intensities of light to different portions of the substrate, or some combination thereof. A mask may be positioned on or adjacent to the surface of the substrate to control which portions of the substrate the light is applied to and/or the intensities of light being applied to different portions of the substrate. The light may be applied to the mask, wherein the mask controls the portions of the substrate to which the light is applied and/or the intensities of the light being applied. In other embodiments, multiple light sources may be directed at different portions of the substrate, wherein the light sources may have varying intensities.

Figure 4:
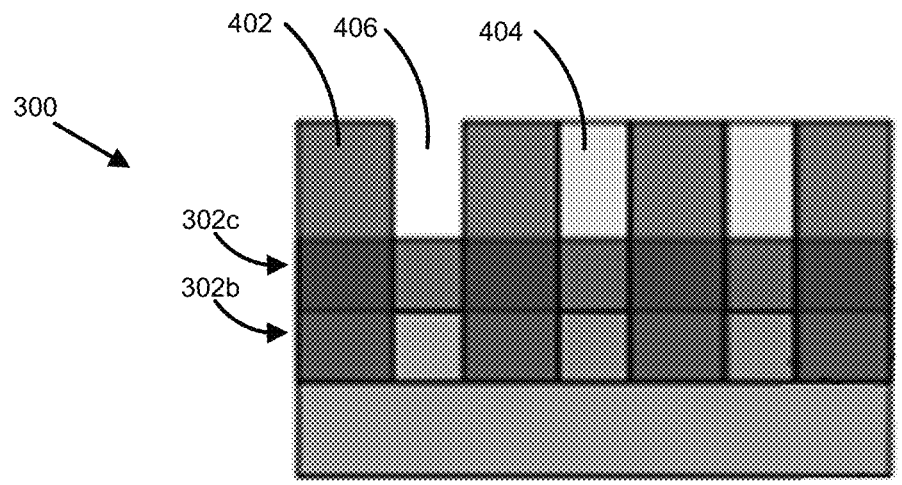
FIG. 4 illustrates the example substrate of FIG. 3 with light applied in accordance with stage 204.

FIG. 4 illustrates a cross-sectional view of the example substrate 300 of FIG. 3 with light applied in accordance with stage 204. In particular, the light may be applied to a surface of the substrate 300 at which the third layer 302c is located.

A first intensity of light 402 may be applied to a first portion of the substrate 300 (as indicated by the darker shaded areas). The first intensity of light 402 may have an intensity that cures both the first PID material in the second layer 302b and the second PID material in the third layer 302c. The first intensity of light 402 may be applied to portions of the substrate 300 where neither trenches nor via recesses are to be produced.

A second intensity of light 404 may be applied to a second portion of the substrate 300 (as indicated by the lighter shaded areas). The second intensity of light 404 may have an intensity that cures the first PID material in the second layer 302b but does not cure the second PID material in the third layer 302c. In particular, the second intensity of light 404 may have an intensity that is less intense than an intensity of the first intensity of light 402. The second intensity of light 404 may be applied to portions of the substrate 300 where trenches are to be produced.

A lack of light 406 (or a low intensity of light) may be applied to a third portion of the substrate 300 (as indicated by the unshaded areas). The lack of light 406 may be applied to portions of the substrate 300 where via recesses are to be produced.

In embodiments where a mask is positioned on or adjacent to the surface of the substrate 300 to control portions of the substrate 300 and/or intensities of the light to be applied to the substrate 300, the mask may comprise a grey scale mask. In particular, the grey scale mask may have one or more openings formed in the grey scale mask where light may pass through unimpeded, one or more transparent portions where light may pass through and have an intensity reduced, and one or more opaque portions where light may not pass through. The first intensity of light 402 may pass through the openings in the grey scale mask, the second intensity of light 404 may pass through the transparent portions of the grey scale mask, and the lack of light 406 may be caused by the opaque portions of the grey scale mask blocking the light.

In embodiments where separate light sources may be utilized, the first intensity of light 402 may be applied by a light source of the first intensity and the second intensity of light 404 may be applied by another light source of the second intensity of light. In some embodiments, multiple light sources may apply the first intensity of light 402 and/or multiple light sources may apply the second intensity of light 404.

Figure 7:
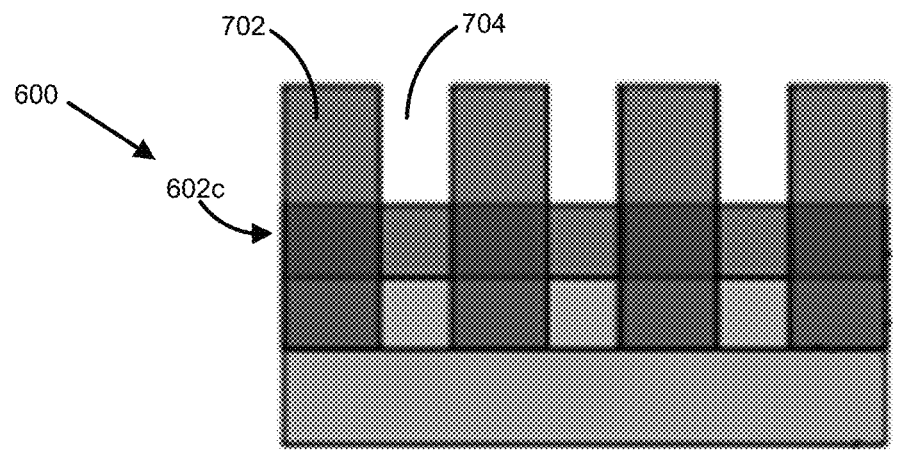
FIG. 7 illustrates the example substrate of FIG. 6 with light applied in accordance with stage 204.

FIG. 7 illustrates the example substrate 600 of FIG. 6 with light applied in accordance with stage 204. Light 702 may be applied to a first portion of the substrate 600 (as indicated by the shaded areas). The light 702 may have an intensity that cures the PID material in the third layer 602c. The light 702 may be applied to portions of the substrate 600 where neither trenches nor via recesses are to be produced.

A lack of light 704 (or a low intensity of light) may be applied to a second portion of the substrate 600 (as indicated by the unshaded areas). The lack of light 704 may be applied to portions of the substrate 600 where trenches are to be produced.

In embodiments where a mask is positioned on or adjacent to the surface of the substrate 600, the mask may comprise a binary mask. In particular, the binary mask may have one or more openings formed in the binary mask where light may pass through and one or more opaque portions where light may not pass through. The light 702 may pass though the openings in the binary mask and the lack of light 704 may be caused by the opaque portions of the binary mask blocking the light.

In stage 206, the uncured portions of the PID material may be removed. In particular, the uncured portions of the PID material may be removed by a wet etch procedure and/or a dry etch procedure applied to the uncured portions. For example, the wet etch procedure may be performed and then the dry etch procedure may be performed. In other embodiments, the uncured portions of the PID material may be removed by an excimer laser procedure, a dry etch procedure, a wet etch procedure, another etch procedure, or some combination thereof, applied to the uncured portions.

Figure 5:
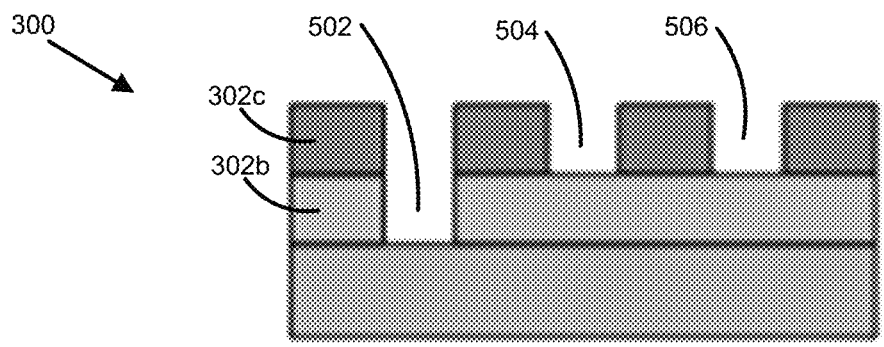
FIG. 5 illustrates a cross-sectional view of the example resultant substrate of FIG. 3 in accordance with stage 206.

FIG. 5 illustrates a cross-sectional view of the example resultant substrate 300 of FIG. 3 in accordance with stage 206. In particular, the uncured portions of the PID material within the substrate 300 may have been removed.

The resultant substrate 300 may have a via recess 502. The via recess 502 may have been formed by removing a portion of the second layer 302b and a portion of the third layer 302c corresponding to a portion of the surface where the lack of light 406 (FIG. 4) was applied in stage 204. The portion of the second layer 302b and the portion of the third layer 302c corresponding to the via recess 502 may have remained uncured in stage 204.

The resultant substrate 300 may have a first trench 504 and a second trench 506. The first trench 504 and the second trench 506 may have been formed by removing portions of the third layer 302c corresponding to portions of the surface where the second intensity of light 404 (FIG. 4) was applied in stage 204. The portions of the third layer 302c corresponding to the first trench 504 and the second trench 506 may have remained uncured in stage 204 while portions of the second layer 302b adjacent to the portions of the third layer 302c may have been cured in stage 204.

Figure 8:
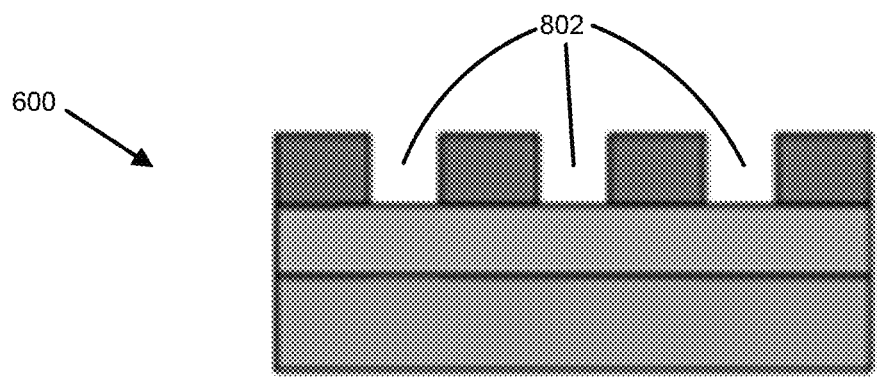
FIG. 8 illustrates a cross-sectional view of the example resultant substrate of FIG. 6 in accordance with stage 206.

FIG. 8 illustrates a cross-sectional view of the example resultant substrate 600 of FIG. 6 in accordance with stage 206. In particular, the uncured portions of the PID material within the substrate 600 may have been removed.

The resultant substrate 600 may have a plurality of trenches 802. The plurality of trenches 802 may have been formed by removing portions of the third layer 602c corresponding to portions of the surface where the second intensity of light 404 (FIG. 4) was applied in stage 204. The portions of the third layer 602c corresponding to the plurality of trenches 802 may have remained uncured in stage 204.

FIG. 9 illustrates an example procedure 900 for producing a substrate, according to various embodiments. In particular, the procedure 900 may be utilized for producing a substrate in embodiments where the substrate includes two adjacent layers that both include PID material, such as the substrate 300 (FIG. 3).

In stage 902, a dielectric layer may provided. Provision of the dielectric layer may include obtaining a dielectric layer with a pad coupled to a surface of the dielectric layer. In other embodiments, provision of the dielectric layer may include coupling a pad to the surface of the dielectric layer.

Figure 10:
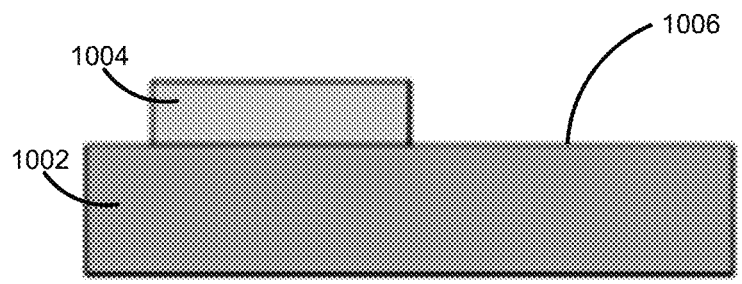
FIG. 10 illustrates a cross-sectional view of an example resultant dielectric layer in accordance with stage 902.

FIG. 10 illustrates a cross-sectional view of an example resultant dielectric layer 1002 in accordance with stage 902. The dielectric layer 1002 may include one or more of the features of the first layer 102a (FIG. 1). In particular, the dielectric layer 1002 may include a dielectric material, such as an organic dielectric material.

A pad 1004 may be coupled to a surface 1006 of the dielectric layer 1002. The pad 1004 may include one or more of the features of the pad 116 (FIG. 1). The pad 1004 may have been coupled to the dielectric layer 1002 or may have been coupled to the dielectric layer 1002, such as via epoxy, as part of the provision of the dielectric layer 1002.

In stage 904, one or more PID layers may be laminated to the dielectric layer. In particular, the PID layers may be laminated to the surface of the dielectric layer on which the pad is coupled. One or more of the PID layers may cover the pad and encompass the pad on the sides of the pad that do not abut the dielectric layer.

Figure 11:
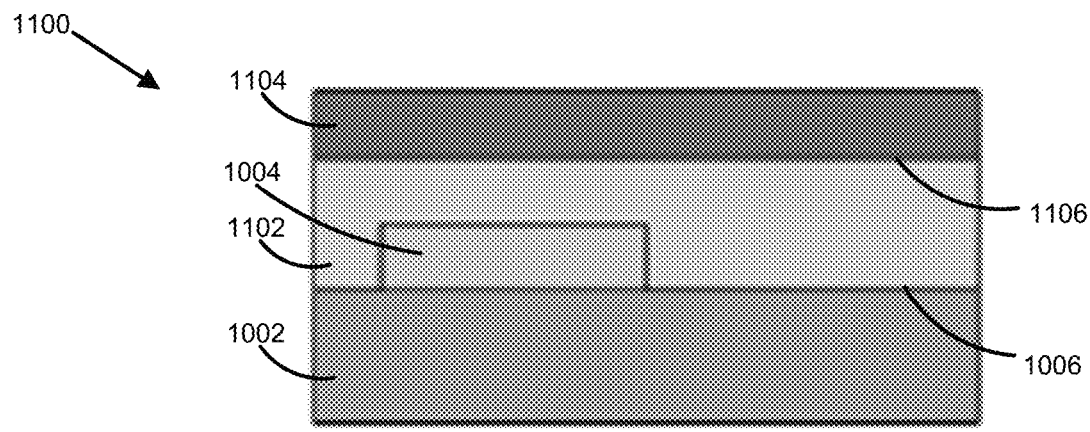
FIG. 11 illustrates a cross-sectional view of an example resultant substrate in accordance with stage 904.

FIG. 11 illustrates a cross-sectional view of an example resultant substrate 1100 in accordance with stage 904. The substrate 1100 may include the dielectric layer 1002 with the pad 1004 coupled to the surface 1006 of the dielectric layer 1002.

The substrate 1100 may further include a first PID layer 1102. The first PID layer 1102 may include one or more of the features of the second layer 102b (FIG. 1). The first PID layer 1102 may have been laminated to the surface 1006 of the dielectric layer 1002. The first PID layer 1102 may cover the pad 1004 and may encompass the pad 1004 on the sides that are not abutted by the dielectric layer 1002.

The substrate 1100 may further include a second PID layer 1104. The second PID layer 1104 may include one or more of the features of the third layer 102c (FIG. 1). The second PID layer 1104 may have been laminated to a surface 1106 of the first PID layer 1102. The second PID layer 1104 may be formed of a different PID material from the first PID layer 1102, wherein the PID material of the second PID layer 1104 may be less sensitive to light than the PID material of the first PID layer 1102. In particular, the PID material of the second PID layer 1104 may require a higher dose of light to cure than the PID material of the first PID layer 1102 requires. Accordingly, the PID material of the first PID layer 1102 may cure in response to a lower intensity of light being applied to the PID layers than an intensity of light that causes the PID material of the second PID layer 1104 to be cured.

In stage 906, a light may be applied to the PID layers and the PID layers may be developed. In particular, stage 906 may include performance of the procedure 200 (FIG. 2). Applying the light to the PID layers may include applying a first intensity of light (such as the first intensity of light 402 (FIG. 4)) to portions of the PID layers where neither a via recess nor a trench are to be formed. Applying the light to the PID layers may further include applying a second intensity of light (such as the second intensity of light 404 (FIG. 4)) to portions of the PID layers where trenches are to be formed. The second intensity of light may be less intense than the first intensity of light. Further, a lack of light (such as the lack of light 406 (FIG. 4)) may be applied to portions of the PID layers where via recesses are to be formed. In some embodiments, a grey scale mask (such as the grey scale mask described in relation to FIG. 4) may be utilized to control the portions to which the light is directed and/or the intensities of the light directed. In other embodiments, multiple light sources with different intensities of light may be utilized to produce the first intensity of light and the second intensity of light.

The development of the PID layers may occur after the light has been applied to the PID layers. The development of the PID layers may include removal of uncured portions of the PID layers, such as by the process described in relation to stage 206 (FIG. 2). In particular, the uncured portions of the PID layers may be removed by an excimer laser procedure, a dry etch procedure, a wet etch procedure, or another etch procedure applied to the uncured portions.

Figure 12:
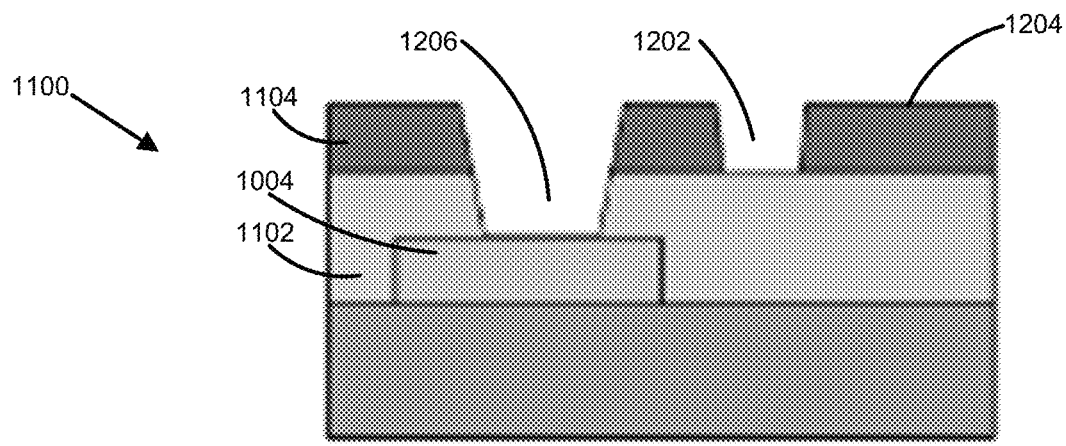
FIG. 12 illustrates a cross-sectional view of the example resultant substrate in accordance with stage 906.

FIG. 12 illustrates a cross-sectional view of the example resultant substrate 1100 in accordance with stage 906. The substrate 1100 may include a trench 1202 located within the second PID layer 1104. The trench 1202 may have been formed via applying the second intensity of light to a portion of a surface 1204 of the second PID layer 1104 that corresponds to the trench 1202. The second intensity of light may have caused the portion of the first PID layer 1102 adjacent to the trench 1202 to be cured, while the portion of the second PID layer 1104 removed to form the trench 1202 may have remained uncured by the application of the second intensity of light. The uncured portion of the second PID layer 1104 may have been removed after the application of the second intensity of light to form the trench 1202.

The substrate 1100 may further include a via recess 1206 located in the second PID layer 1104 and extending through a portion of the first PID layer 1102 to the pad 1004. The via recess 1206 may have been formed via a lack of light being applied to a portion of the surface 1204 of the second PID layer 1104 that corresponds to the via recess 1206. The lack of light may have caused the portion of the second PID layer 1104 and the portion of the first PID layer 1102 removed to form the via recess 1206 to remain uncured. The uncured portions of the second PID layer 1104 and the first PID layer 1102 may have been removed after the lack of light being applied to form the via recess 1206. Due to the via recess 1206 being formed by the portion of the second PID layer 1104 and the portion of the first PID layer 1102 being uncured and removing the uncured portions, the angle of the sidewalls of the via recess 1206 may be approximately (within fifteen degrees) perpendicular to the surface 1204.

Application of the light to the substrate 1100 may have included positioning the grey scale mask on or adjacent to the surface 1204 of the second PID layer 1104. Light may then be directed at the grey scale mask, wherein the grey scale mask controls the application of light to the surface 1204 of the second PID layer 1104. In particular, the grey scale mask may have openings that allow the light to pass through to produce the first intensity of light, transparent regions that allow the light to pass through at a reduced intensity to produce the second intensity of light, and opaque regions that do not allow the light to pass through to produce the lack of light. In the illustrated embodiment, the grey scale mask may have been positioned on or adjacent to the surface 1204 with an opaque region located adjacent to the location of the via recess 1206, a transparent region located adjacent to the location of the trench 1202, and openings located adjacent to the remainder of the surface 1204 when the light is directed at the grey scale mask.

In other embodiments, the application of light to the substrate 1100 may have included multiple light sources directing different intensities of light at the PID layers. In particular, a first light source may have directed the second intensity of light at the portion of the surface 1204 where the trench 1202 is located, and a second light source may have directed the first intensity of light, which is greater than the second intensity of light, at the portions of the surface 1204 where neither the via recess 1206 nor the trench 1202 are located.

In stage 908, a seed deposition procedure may be performed. The seed deposition procedure may form a seed layer on a surface of the substrate, on the walls of the via recesses, on the walls of the trenches, or some combination thereof. The seed layer may include copper.

Figure 13:
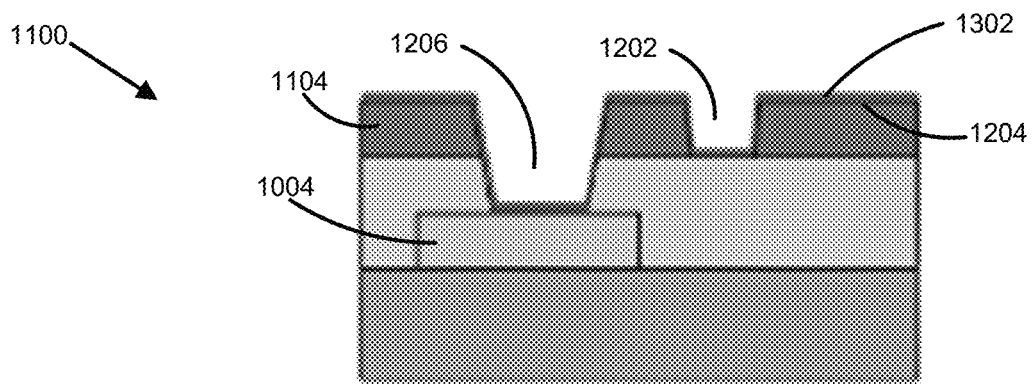
FIG. 13 illustrates a cross-sectional view of the example resultant substrate in accordance with stage 908.

FIG. 13 illustrates a cross-sectional view of the example resultant substrate 1100 in accordance with stage 908. The substrate 1100 may include a seed layer 1302, which may have been formed by the seed deposition procedure. The seed layer 1302 may be located on the surface 1204, on the walls of the via recess 1206, and on the walls of the trench 1202. In particular, the seed layer 1302 may be located on the sidewalls and the lower wall of the via recess 1206, and on the sidewalls and the lower wall of the trench 1202. Further, since the lower wall of the via recess 1206 is located at the pad 1004, a portion of the seed layer 1302 may be located on the pad 1004.

In stage 910, a layer-resist may be formed on the seed layer. In particular, the layer-resist may be formed on a portion of the seed layer located on the surface of the second PID layer. Forming the seed layer may include applying the layer-resist to the seed layer. The layer-resist may comprise a photoresist. For example, the layer-resist may comprise a dry film photoresist applied on the seed layer.

Forming the layer-resist may include forming one or more openings in the layer-resist. The openings may be formed at locations where conductive elements are to be formed on the substrate. The openings may leave portions of the seed layer exposed that correspond to the locations where the conductive elements are to be formed on the substrate.

Forming the openings may include positioning a binary mask (such as the binary mask described in relation to FIG. 7) on, or adjacent to, the layer-resist. The binary mask may have one or more openings where light may pass through and one or more opaque portions where light may not pass through. The opaque portions of the binary mask may correspond to the locations where the openings are to be formed in the layer-resist, whereas the openings of the binary mask may correspond to the portions of the layer-resist where the openings are not to be formed in the layer-resist. Light may be applied at the binary mask, wherein a portion of the light may pass through the openings and the portion of light may contact the layer-resist at the locations where the openings are not to be formed in the layer-resist. The portions of the layer-resist contacted by the light may be cured by the application of the light.

Forming the openings may further include removing the uncured portions of the layer-resist. In particular, the uncured portions of the uncured portions of the layer-resist may be removed by a wet etch procedure and/or a dry etch procedure applied to the uncured portions. For example, the wet etch procedure may be performed and then then the dry etch procedure may be performed. In other embodiments, the uncured portions of the layer-resist may be removed by an excimer laser procedure, a dry etch procedure, a wet etch procedure, another etch procedure, or some combination thereof, applied to the uncured portions. Removing the uncured portions of the layer-resist may result in the openings being formed in the layer-resist corresponding to the portions of the seed layer at which the conductive elements are to be formed on the substrate.

The description of stage 910 above may refer to a negative tone layer-resist. In other embodiments, the layer-resist may comprise a positive tone layer-resist. In the positive tone laser-resist embodiments, the portions of the laser-resist to which the light is applied and to which the light does not contact may be swapped from the description of the negative tone laser-resist.

Figure 14:
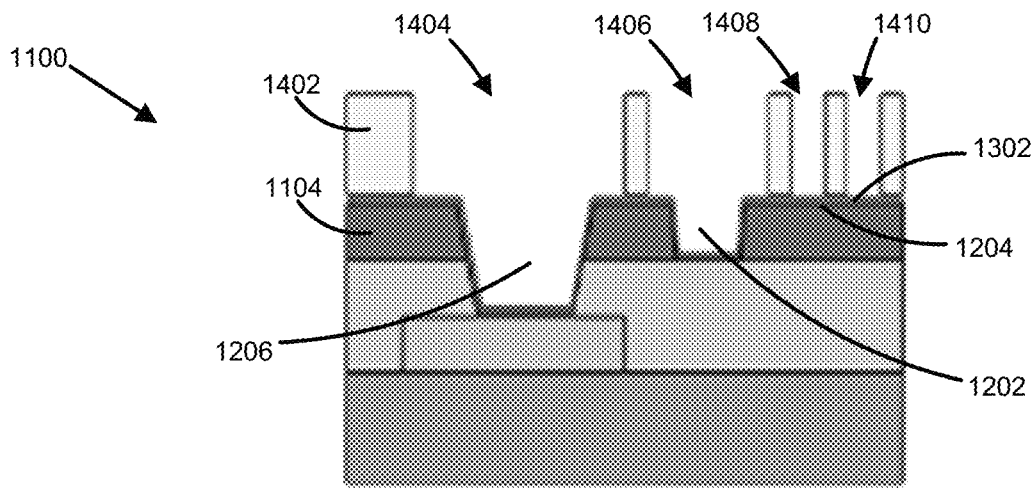
FIG. 14 illustrates a cross-sectional view of the example resultant substrate in accordance with stage 910.

FIG. 14 illustrates a cross-sectional view of the example resultant substrate 1100 in accordance with stage 910. A layer-resist 1402 may be formed on the seed layer 1302 of the substrate 1100. The layer-resist 1402 may have a first opening 1404, a second opening 1406, a third opening 1408, and a fourth opening 1410. The first opening 1404 may be aligned with the via recess 1206 and may be utilized to form a via within the via recess 1206 and on the surface 1204 of the second PID layer 1104. The second opening 1406 may be aligned with the trench 1202 and may be utilized to form a trace within the trench 1202 and on the surface 1204 of the second PID layer 1104. The third opening 1408 and the fourth opening 1410 may be aligned with a portion of the surface 1204 where neither a via recess nor a trench was formed, and may be utilized to form traces on the surface 1204 of the second PID layer 1104.

In stage 912, an electroplating procedure may be performed. The electroplating procedure may be performed with the layer-resist still positioned on the seed layer from stage 910. The electroplating procedure may result in one or more conductive elements being formed on the exposed surfaces of the substrate, the exposed surfaces being the surfaces not covered by the layer-resist. The electroplating procedure may include forming the conductive elements to extend at a uniform distance above the surface of the substrate.

Figure 15:
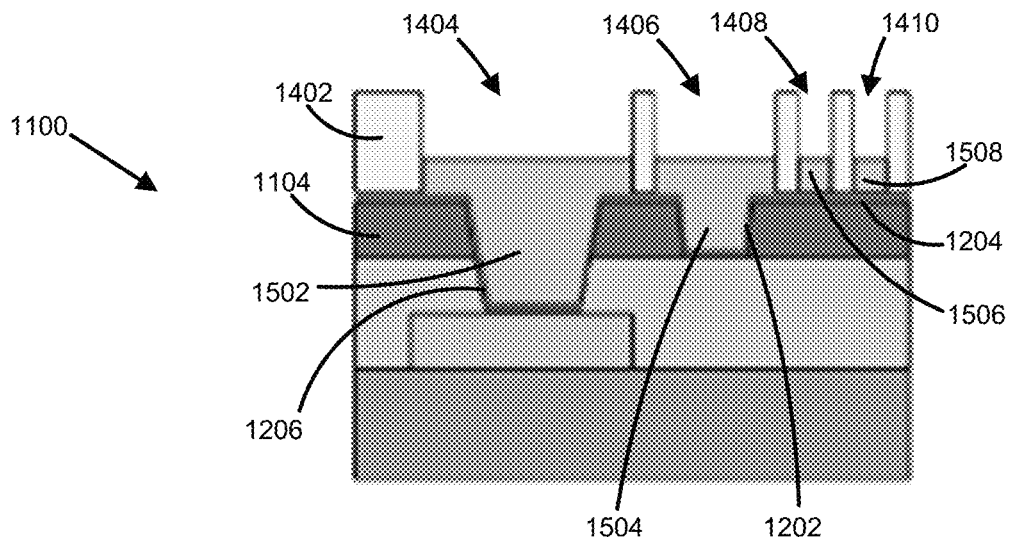
FIG. 15 illustrates a cross-sectional view of the example resultant substrate in accordance with stage 912.

FIG. 15 illustrates a cross-sectional view of the example resultant substrate 1100 in accordance with stage 912. The substrate 1100 may include first conductive element 1502 formed by the electroplating procedure. The first conductive element 1502 may comprise a via. The first conducive element 1502 may fill the via recess 1206 and extend above the surface 1204 of the second PID layer 1104 by a certain distance. In particular, the electroplating procedure may deposit conductive material into a recess formed by the first opening 1404 of the layer-resist 1402 and the via recess 1206, and may fill the recess with the conductive material to the certain distance above the surface 1204. The first conducive element 1502 may include one or more of the features of the first conductive element 118 (FIG. 1).

The substrate 1100 may further include a second conductive element 1504 formed by the electroplating procedure.

The second conductive element 1504 may comprise a first trace. The second conductive element 1504 may fill the trench 1202 and extend above the surface 1204 of the second PID layer 1104 by the certain distance. In particular, the electroplating procedure may deposit conductive material into a recess formed by the second opening 1406 of the layer-resist 1402 and the trench 1202, and may fill the recess with the conductive material to the certain distance above the surface 1204. The second conductive element 1504 may include one or more of the features of the second conductive element 120 (FIG. 1).

The substrate 1100 may further include a third conductive element 1506 formed by the electroplating procedure. The third conductive element 1506 may comprise a second trace. The third conductive element 1506 may be located on the surface 1204 of the second PID layer 1104 and extend above the surface 1204 by the certain distance. In particular, the electroplating procedure may deposit conductive material into a recess formed by the third opening 1408 of the layer-resist 1402 and may fill the recess with the conductive material to the certain distance above the surface 1204. The third conductive element 1506 may have a thickness less than a thickness of the second conductive element 1504 due to the trench 1202. The third conductive element 1506 may include one or more of the features of the third conductive element 122 (FIG. 1).

The substrate 1100 may further include a fourth conductive element 1508 formed by the electroplating procedure. The fourth conductive element 1508 may comprise a third trace. The fourth conductive element 1508 may be located on the surface 1204 of the second PID layer 1104 and extend above the surface 1204 by the certain distance. In particular, the electroplating procedure may deposit conductive material into a recess formed by the fourth opening 1410 of the layer-resist 1402, and may fill the recess with the conductive material to the certain distance above the surface 1204. The fourth conductive element 1508 may have a thickness less than a thickness of the second conductive element 1504 due to the trench 1202. The fourth conductive element 1508 may include one or more of the features of the fourth conductive element 124 (FIG. 1).

In stage 914, the layer-resist may be removed. In particular, the layer-resist formed in stage 910 may be removed from the substrate. The layer-resist may be removed by an excimer laser procedure in some embodiments. In other embodiments, the layer-resist may be removed by an excimer laser procedure, a dry etch procedure, a wet etch procedure, another etch procedure, or some combination thereof.

Figure 16:
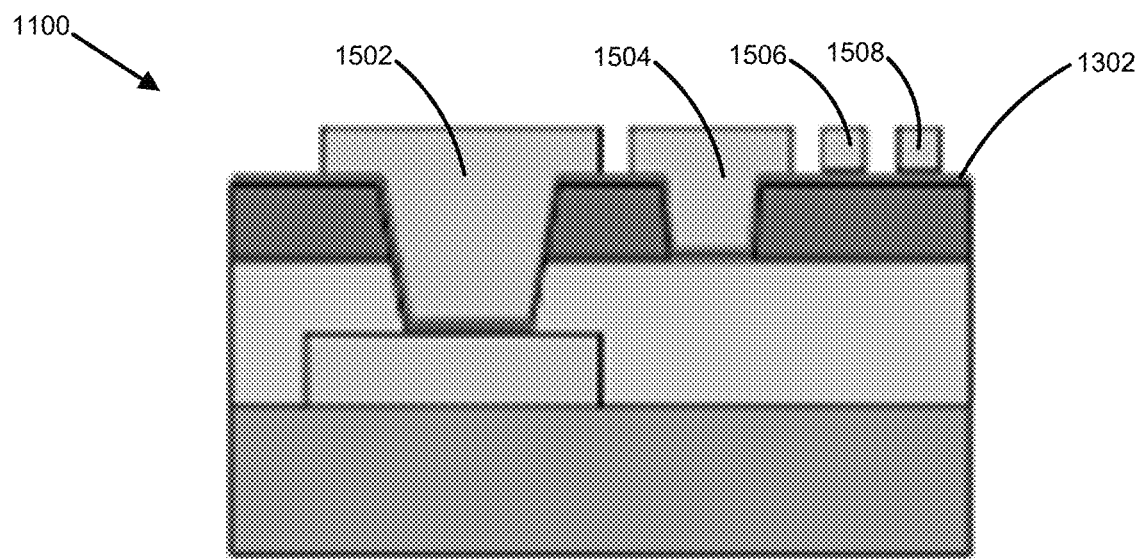
FIG. 16 illustrates a cross-sectional view of the example resultant substrate in accordance with stage 914.

FIG. 16 illustrates a cross-sectional view of the example resultant substrate 1100 in accordance with stage 914. The layer-resist 1402 (FIG. 14) may have been removed from being positioned on the seed layer 1302. Removal of the layer-resist 1402 may have produced spaces located between the first conductive element 1502, the second conductive element 1504, the third conductive element 1506, and the fourth conductive element 1508.

In stage 916, exposed portions of the seed layer may be removed. In particular, portions of the seed layer left exposed, without being covered by conductive elements formed in stage 912, may be removed. The portions of the seed layer may be removed via an excimer laser procedure, a dry etch procedure, a wet etch procedure, another etch procedure, or some combination thereof.

Figure 17:
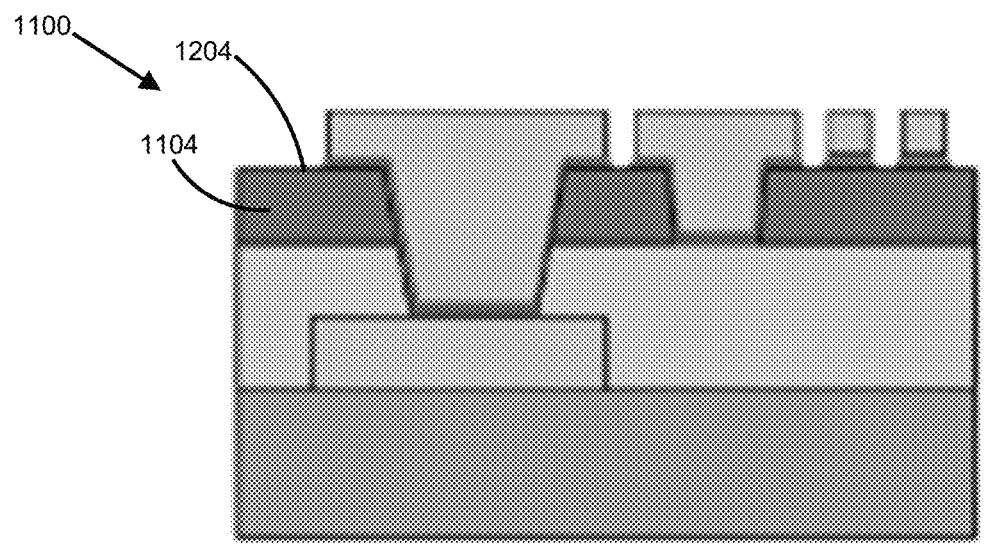
FIG. 17 illustrates a cross-sectional view of the example resultant substrate in accordance with stage 916.

FIG. 17 illustrates a cross-sectional view of the example resultant substrate 1100 in accordance with stage 916. The portions of the seed layer 1302 (FIG. 16) remaining exposed may have been removed in stage 916. In particular, the portions of the seed layer 1302 between the first conductive element 1502, the second conductive element 1504, the third conductive element 1506, and the fourth conductive element 1508 may have been removed in stage 916. Accordingly, the surface 1204 of the second PID layer 1104 may be exposed between the first conductive element 1502, the second conductive element 1504, the third conductive element 1506, and the fourth conductive element 1508.

Figure 18:
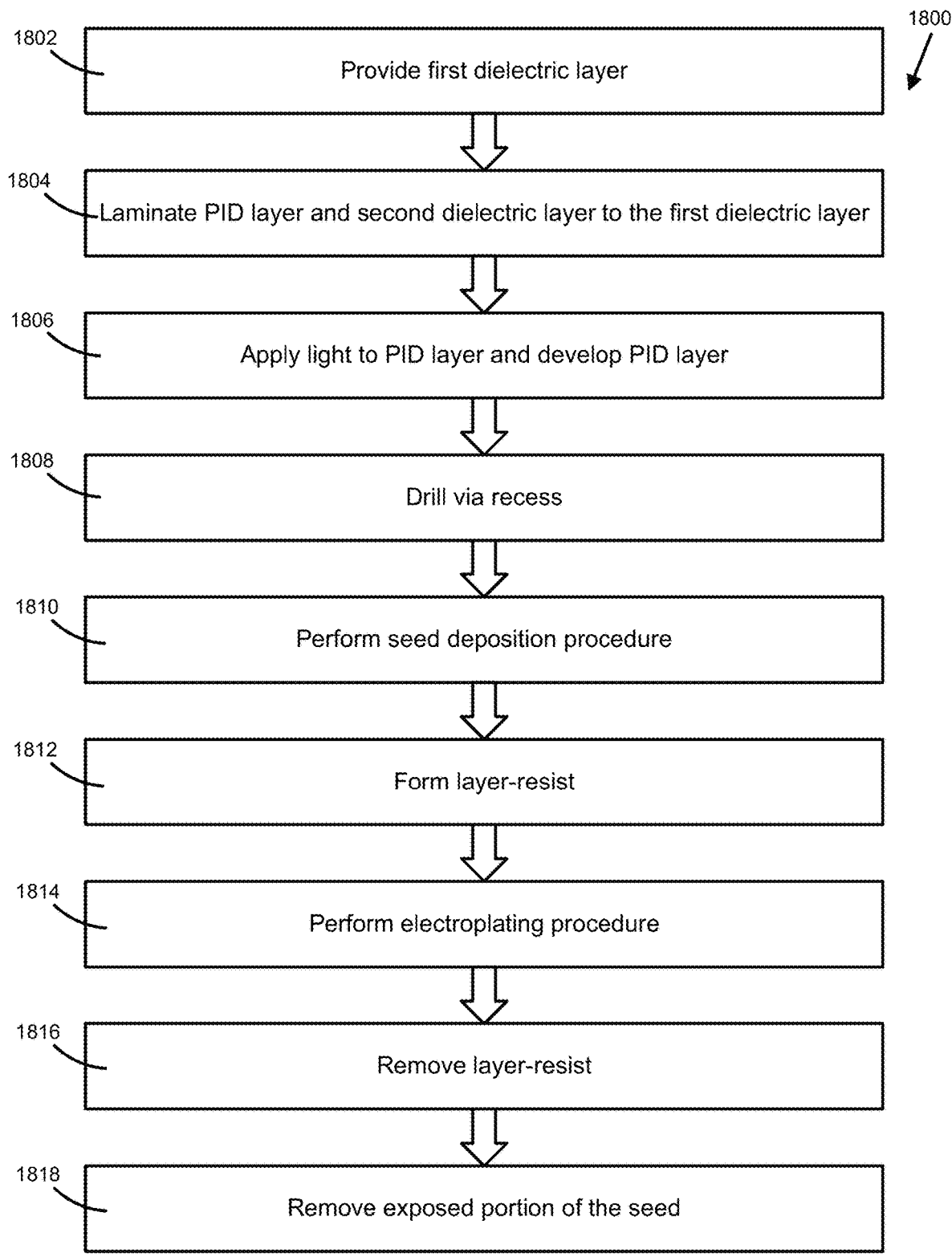
FIG. 18 illustrates another example procedure for producing a substrate, according to various embodiments.

FIG. 18 illustrates another example procedure 1800 for producing a substrate, according to various embodiments. In particular, the procedure 1800 may be utilized for producing a substrate in embodiments where the substrate includes a single layer that includes a PID material, such as the substrate 300 (FIG. 3).

In stage 1802, a first dielectric layer may be provided. Provision of the first dielectric layer may include obtaining a dielectric layer with a pad coupled to a surface of the dielectric layer. In other embodiments, provision of the dielectric layer may include coupling a pad to the surface of the dielectric layer.

Figure 19:
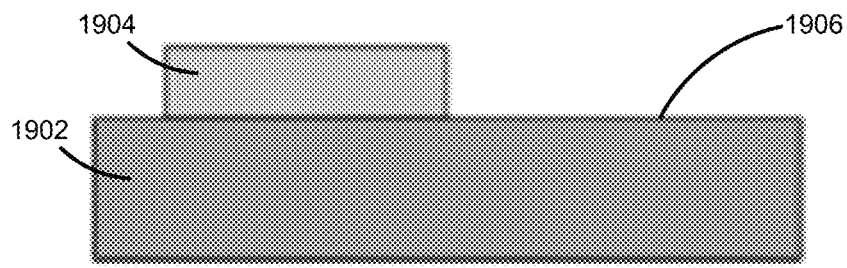
FIG. 19 illustrates a cross-sectional view of an example resultant dielectric layer in accordance with stage 1802.

FIG. 19 illustrates a cross-sectional view of an example resultant dielectric layer 1902 in accordance with stage 1802. The dielectric layer 1902 may include one or more of the features of the first layer 102*a* (FIG. 1). In particular, the dielectric layer 1902 may include a dielectric material, such as an organic dielectric material.

A pad 1904 may be coupled to a surface 1906 of the dielectric layer 1902. The pad 1904 may include one or more of the features of the pad 116 (FIG. 1). The pad 1904 may have been coupled to the dielectric layer 1902 or may have been coupled to the dielectric layer 1902, such as via epoxy, as part of the provision of the dielectric layer 1902.

In stage 1804, a PID layer and a second dielectric layer may be laminated to the first dielectric layer. In particular, the second dielectric layer may be laminated to the surface of the first dielectric layer on which the pad is coupled. The PID layer may be laminated on a surface of the second dielectric layer that is opposite to the first dielectric layer. The second dielectric layer may cover the pad and encompass the pad on the sides of the pad that do not abut the first dielectric layer.

Figure 20:
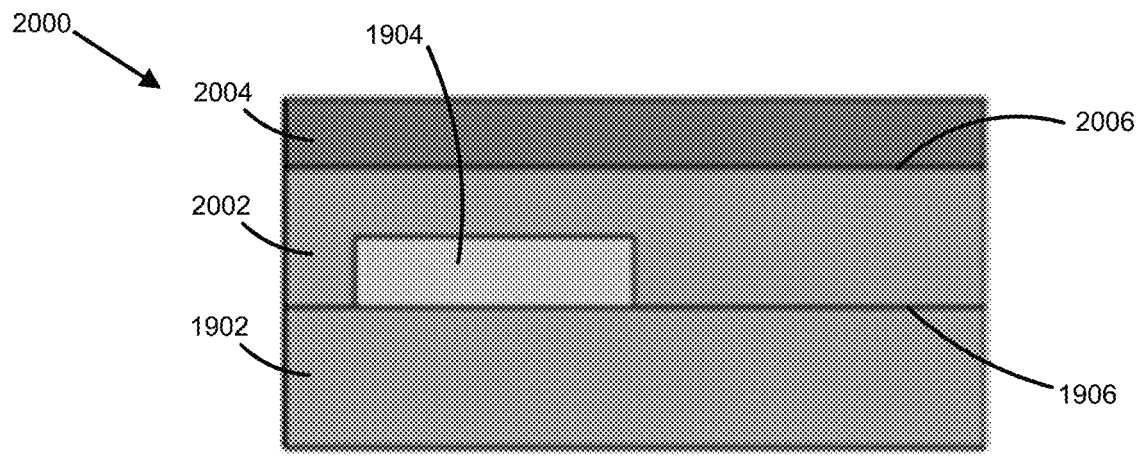
FIG. 20 illustrates a cross-sectional view of an example resultant substrate in accordance with stage 1804.

FIG. 20 illustrates a cross-sectional view of an example resultant substrate 2000 in accordance with stage 1804. The substrate 2000 may include the first dielectric layer 1902 with the pad 1904 coupled to the surface 1906 of the first dielectric layer 1902.

The substrate 2000 may further include a second dielectric layer 2002. The second dielectric layer 2002 may include one or more of the features of the second layer 102*b* (FIG. 1). The second dielectric layer 2002 may have been laminated to the surface 1906 of the first dielectric layer 1902. The second dielectric layer 2002 may cover the pad 1904 and may encompass the pad 1904 on the sides that are not abutted by the dielectric layer 1902.

The substrate 2000 may further include a PID layer 2004. The PID layer 2004 may include one or more of the features of the third layer 102*c* (FIG. 1). The PID layer 2004 may have been laminated to a surface 2006 of the second dielectric layer 2002.

In stage 1806, a light may be applied to the PID layer and the PID layer may be developed. In particular, stage 1806 may include performance of the procedure 200 (FIG. 2). Applying the light to the PID layer may include applying light (such as the light 702 (FIG. 7)) to portions of the PID layer where a trench is not to be formed. A lack of light (such as the lack of light 704 (FIG. 7)) may be applied to portions of the PID layer where trenches are to be formed. In some embodiments, a binary mask (such as the binary mask described in relation to FIG. 7) may be utilized to control the portions to which the light is directed. In other embodiments, multiple light sources may be utilized to produce the light.

The development of the PID layer may occur after the light has been applied to the PID layer. The development of the PID layer may include removal of uncured portions of the PID layer, such as by the process described in relation to stage 206 (FIG. 2). In particular, the uncured portions of the PID layer may be removed by a wet etch procedure. In other embodiments, the uncured portions of the PID layer may be removed by an excimer laser procedure, a dry etch procedure, a wet etch procedure, or another etch procedure applied to the uncured portions.

Figure 21:
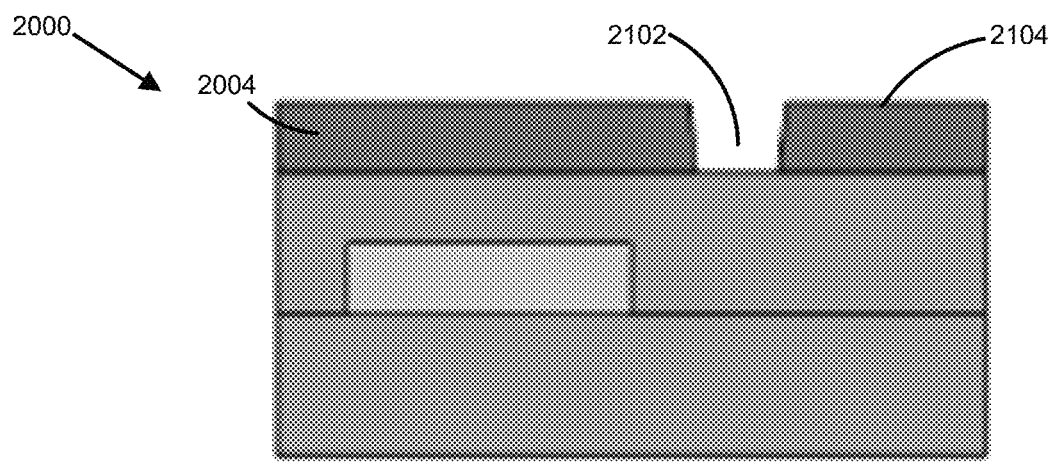
FIG. 21 illustrates a cross-sectional view of the example resultant substrate in accordance with stage 1806.

FIG. 21 illustrates a cross-sectional view of the example resultant substrate 2000 in accordance with stage 1806. The substrate 2000 may include a trench 2102 located within the PID layer 2004. The trench 2102 may have been formed via a lack of light being applied to a portion of a surface 2104 of the PID layer 2004 that corresponds to the trench 2102. The lack of light may have caused the portion of the PID layer 2004 removed to form the trench 2102 to remain uncured. The uncured portion of the PID layer 2004 may have been removed after the lack of light being applied to form the trench 2102.

Application of the light to the substrate 2000 may have included positioning the binary mask on or adjacent to the surface 2104 of the PID layer 2004. Light may then be directed at the binary mask, wherein the binary mask controls the application of light to the surface 2104 of the PID layer 2004. In particular, the binary mask may have openings that allow the light to pass through to produce the light and opaque regions that do not allow the light to pass through to produce the lack of light. In the illustrated embodiment, the binary mask may have been positioned on or adjacent to the surface 2104 with an opaque region located adjacent to the location of the trench 2102 and openings located adjacent to the remainder of the surface 2104 when the light is directed at the binary mask.

In other embodiments, the application of light to the substrate 2000 may have included multiple light sources directing light at the PID layer. In particular, a first light source may have directed light at a portion of the surface 1204 on one side of where the trench 1202 is located and a second light source may have directed light at a portion of the surface 1204 on the other side of wherein the trench 1202 is located.

In stage 1808, a via recess may be drilled. A laser drill may be utilized to drill a via recess in the PID layer, wherein the via recess may extend through a portion of the second dielectric layer to the pad. After the via recess has been drilled, a desmear process may be performed on the substrate to remove any particles remaining from drilling the via recess.

Figure 22:
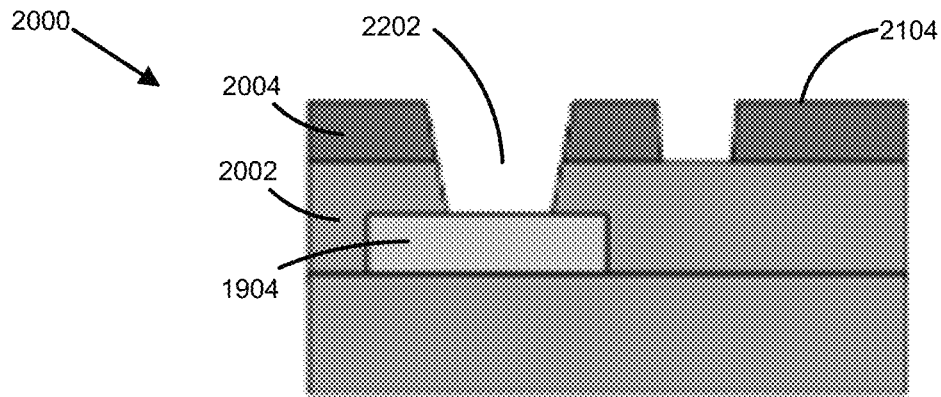
FIG. 22 illustrates a cross-sectional view of the example resultant substrate in accordance with stage 1808.

FIG. 22 illustrates a cross-sectional view of the example resultant substrate 2000 in accordance with stage 1808. The substrate 2000 may include a via recess 2202. The via recess 2202 may have been formed by utilizing a laser drill to drill the via recess 2202 in stage 1808. The via recess 2202 may extend through the PID layer 2004 and a portion of the second dielectric layer 2002 to the pad 1904. Due to the via recess 2202 being formed by a laser drill, the slope of the sidewalls of the via recess 2202 may be at angles between 70 degrees and 80 degrees to the surface 2104. A wet chemical clean process may have been performed on the substrate after the via recess 2202 was drilled.

In stage 1810, a seed deposition procedure may be performed. The seed deposition procedure may form a seed layer on a surface of the substrate, on the walls of the via recesses, on the walls of the trenches, or some combination thereof. The seed layer may include copper.

Figure 23:
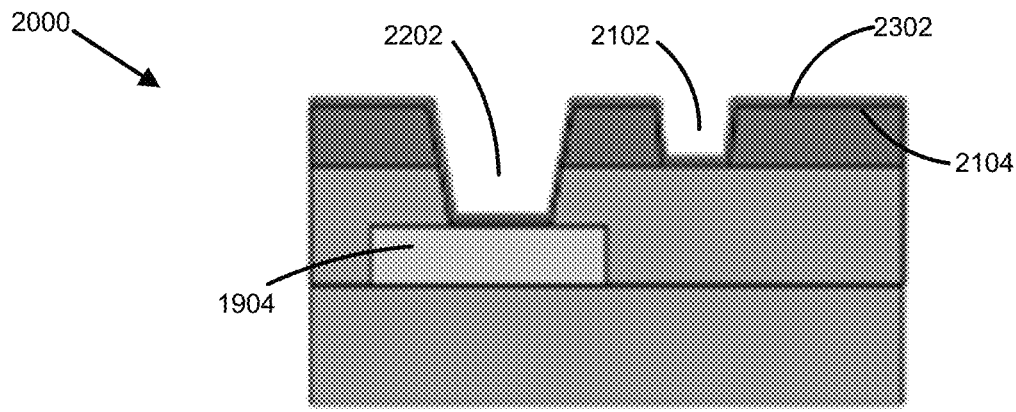
FIG. 23 illustrates a cross-sectional view of the example resultant substrate in accordance with stage 1810.

FIG. 23 illustrates a cross-sectional view of the example resultant substrate 2000 in accordance with stage 1810. The substrate 2000 may include a seed layer 2302, which may have been formed by the seed deposition procedure. The seed layer 2302 may be located on the surface 2104, on the walls of the via recess 2202, and on the walls of the trench 2102. In particular, the seed layer 2302 may be located on the sidewalls and the lower wall of the via recess 2202, and on the sidewalls and the lower wall of the trench 2102. Further, since the lower wall of the via recess 2202 is located at the pad 1904, a portion of the seed layer 2302 may be located on the pad 1904.

In stage 1812, a layer-resist may be formed on the seed layer. In particular, the layer-resist may be formed on a portion of the seed layer located on the surface of the PID layer. Forming the seed layer may include applying the layer-resist to the seed layer. The layer-resist may comprise a photoresist. For example, the layer-resist may comprise a dry film photoresist applied on the seed layer.

Forming the layer-resist may include forming one or more openings in the layer-resist. The openings may be formed at locations where conductive elements are to be formed on the substrate. The openings may leave portions of the seed layer exposed that correspond to the locations where the conductive elements are to be formed on the substrate.

Forming the openings may include positioning a binary mask (such as the binary mask described in relation to FIG. 7) on, or adjacent to, the layer-resist. The binary mask may have one or more openings where light may pass through and one or more opaque portions where light may not pass through. The opaque portions of the binary mask may correspond to the locations where the openings are to be formed in the layer-resist, whereas the openings of the binary mask may correspond to the portions of the layer-resist where the openings are not to be formed in the layer-resist. Light may be applied at the binary mask, wherein a portion of the light may pass through the openings and the portion of light may contact the layer-resist at the locations where the openings are not to be formed in the layer-resist. The portions of the layer-resist contacted by the light may be cured by the application of the light.

Forming the openings may further include removing the uncured portions of the layer-resist. In particular, the uncured portions of the uncured portions of the layer-resist may be removed by a wet etch procedure and/or a dry etch procedure applied to the uncured portions. For example, the wet etch procedure may be performed and then then the dry etch procedure may be performed. In other embodiments, the uncured portions of the layer-resist may be removed by an excimer laser procedure, a dry etch procedure, a wet etch procedure, another etch procedure, or some combination thereof, applied to the uncured portions. Removing the uncured portions of the layer-resist may result in the openings being formed in the layer-resist corresponding to the portions of the seed layer at which the conductive elements are to be formed on the substrate.

The description of stage 1812 above may refer to a negative tone layer-resist. In other embodiments, the layer-resist may comprise a positive tone layer-resist. In the positive tone laser-resist embodiments, the portions of the laser-resist to which the light is applied and to which the light does not contact may be swapped from the description of the negative tone laser-resist.

Figure 24:
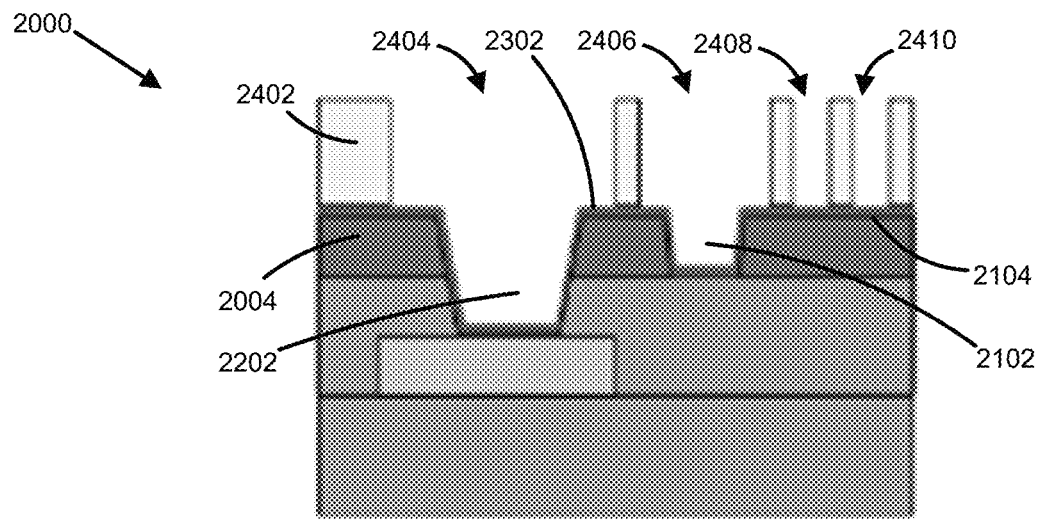
FIG. 24 illustrates a cross-sectional view of the example resultant substrate in accordance with stage 1812.

FIG. 24 illustrates a cross-sectional view of the example resultant substrate 2000 in accordance with stage 1812. A layer-resist 2402 may be positioned on the seed layer 2302 of the substrate 2000. The layer-resist 2402 may have a first opening 2404, a second opening 2406, a third opening 2408, and a fourth opening 2410. The first opening 2404 may be aligned with the via recess 2202 and may be utilized to form a via within the via recess 2202 and on the surface 2104 of the PID layer 2004. The second opening 2406 may be aligned with the trench 2102 and may be utilized to form a trace within the trench 2102 and on the surface 2104 of the PID layer 2004. The third opening 2408 and the fourth opening 2410 may be aligned with a portion of the surface 2104 where neither a via recess nor a trench was formed, and may be utilized to form traces on the surface 2104 of the second PID layer 2004.

In stage 1814, an electroplating procedure may be performed. The electroplating procedure may be performed with the layer-resist still positioned on the seed layer from stage 1812. The electroplating procedure may result in one or more conductive elements being formed on the exposed surfaces of the substrate, the exposed surfaces being the surfaces not covered by the layer-resist. The electroplating procedure may include forming the conductive elements to extend at a uniform distance above the surface of the substrate.

Figure 25:
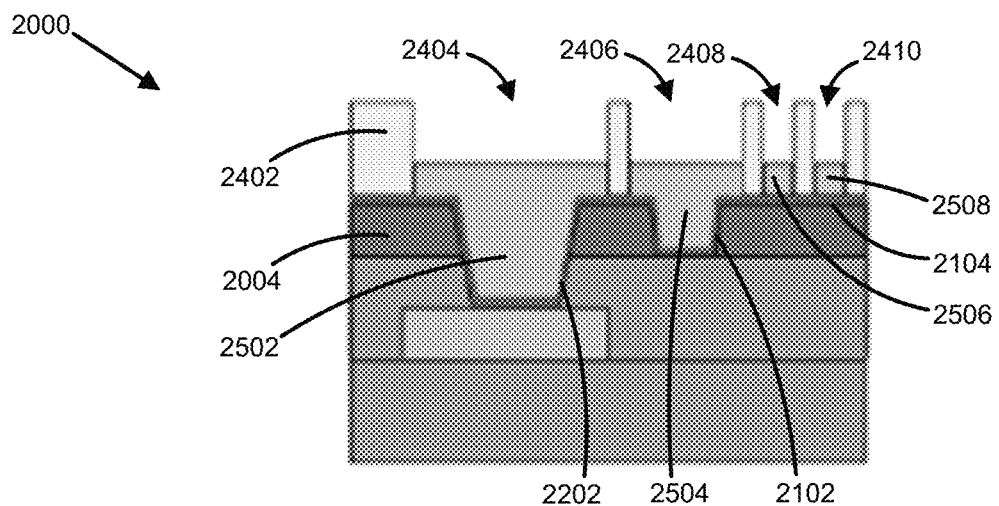
FIG. 25 illustrates a cross-sectional view of the example resultant substrate in accordance with stage 1814.

FIG. 25 illustrates a cross-sectional view of the example resultant substrate 2000 in accordance with stage 1814. The substrate 2000 may include first conductive element 2502 formed by the electroplating procedure. The first conductive element 2502 may comprise a via. The first conducive element 2502 may fill the via recess 2202 and extend above the surface 2104 of the PID layer 2004 by a certain distance. In particular, the electroplating procedure may deposit conductive material into a recess formed by the first opening 2404 of the layer-resist 2402 and the via recess 2202, and may fill the recess with the conductive material to the certain distance above the surface 2104. The first conducive element 2502 may include one or more of the features of the first conductive element 118 (FIG. 1).

The substrate 2000 may further include a second conductive element 2504 formed by the electroplating procedure. The second conductive element 2504 may comprise a first trace. The second conductive element 2504 may fill the trench 2102 and extend above the surface 2104 of the PID layer 2004 by the certain distance. In particular, the electroplating procedure may deposit conductive material into a recess formed by the second opening 2406 of the layer-resist 2402 and the trench 2102, and may fill the recess with the conductive material to the certain distance above the surface 2104. The second conductive element 2504 may include one or more of the features of the second conductive element 120 (FIG. 1).

The substrate 2000 may further include a third conductive element 2506 formed by the electroplating procedure. The third conductive element 2506 may comprise a second trace. The third conductive element 2506 may be located on the surface 2104 of the PID layer 2004 and extend above the surface 2104 by the certain distance. In particular, the electroplating procedure may deposit conductive material into a recess formed by the third opening 2408 of the layer-resist 2402 and may fill the recess with the conductive material to the certain distance above the surface 2104. The third conductive element 2506 may have a thickness less than the thickness of the second conductive element 2504 due to the trench 2102. The third conductive element 2506 may include one or more of the features of the third conductive element 122 (FIG. 1).

The substrate 2000 may further include a fourth conductive element 2508 formed by the electroplating procedure. The fourth conductive element 2508 may comprise a third trace. The fourth conductive element 2508 may be located on the surface 2104 of the PID layer 2004 and extend above the surface 2104 by the certain distance. In particular, the electroplating procedure may deposit conductive material into a recess formed by the fourth opening 2410 of the layer-resist 2402, and may fill the recess with the conductive material to the certain distance above the surface. The fourth conductive element 2508 may have a thickness less than the thickness of the second conductive element 2504 due to the trench 2102. The fourth conductive element 2508 may include one or more of the features of the fourth conductive element 124 (FIG. 1).

In stage 1816, the layer-resist may be removed. In particular, the layer-resist positioned in stage 1812 may be removed from the substrate. The layer-resist may be removed by an excimer laser procedure in some embodiments. In other embodiments, the layer-resist may be removed by an excimer laser procedure, a dry etch procedure, a wet etch procedure, another etch procedure, or some combination thereof.

Figure 26:
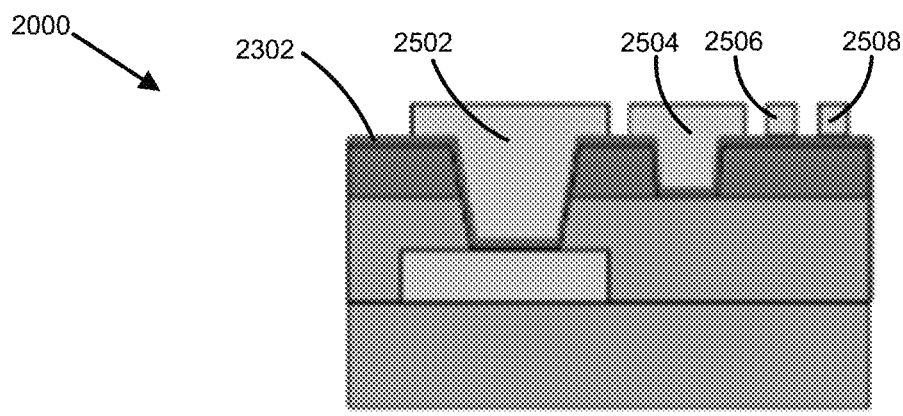
FIG. 26 illustrates a cross-sectional view of the example resultant substrate in accordance with stage 1816.

FIG. 26 illustrates a cross-sectional view of the example resultant substrate 2000 in accordance with stage 1816. The layer-resist 2402 (FIG. 24) may have been removed from being positioned on the seed layer 2302. Removal of the layer-resist 2402 may have produced spaces located between the first conductive element 2502, the second conductive element 2504, the third conductive element 2506, and the fourth conductive element 2508.

In stage 1818, exposed portions of the seed layer may be removed. In particular, portions of the seed layer left exposed, without being covered by conductive elements formed in stage 1814, may be removed. The portions of the seed layer may be removed via an excimer laser procedure, a dry etch procedure, a wet etch procedure, another etch procedure, or some combination thereof.

Figure 27:
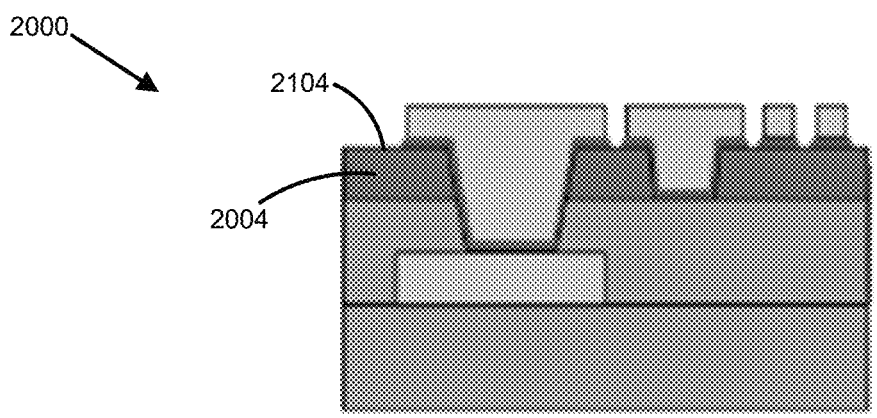
FIG. 27 illustrates a cross-sectional view of the example resultant substrate in accordance with stage 1818.

FIG. 27 illustrates a cross-sectional view of the example resultant substrate 2000 in accordance with stage 1818. The portions of the seed layer 2302 (FIG. 26) remaining exposed may have been removed in stage 1818. In particular, the portions of the seed layer 2302 between the first conductive element 2502, the second conductive element 2504, the third conductive element 2506, and the fourth conductive element 2508 may have been removed in stage 1818. Accordingly, the surface 2104 of the PID layer 2004 may be exposed between the first conductive element 2502, the second conductive element 2504, the third conductive element 2506, and the fourth conductive element 2508.

Figure 28:
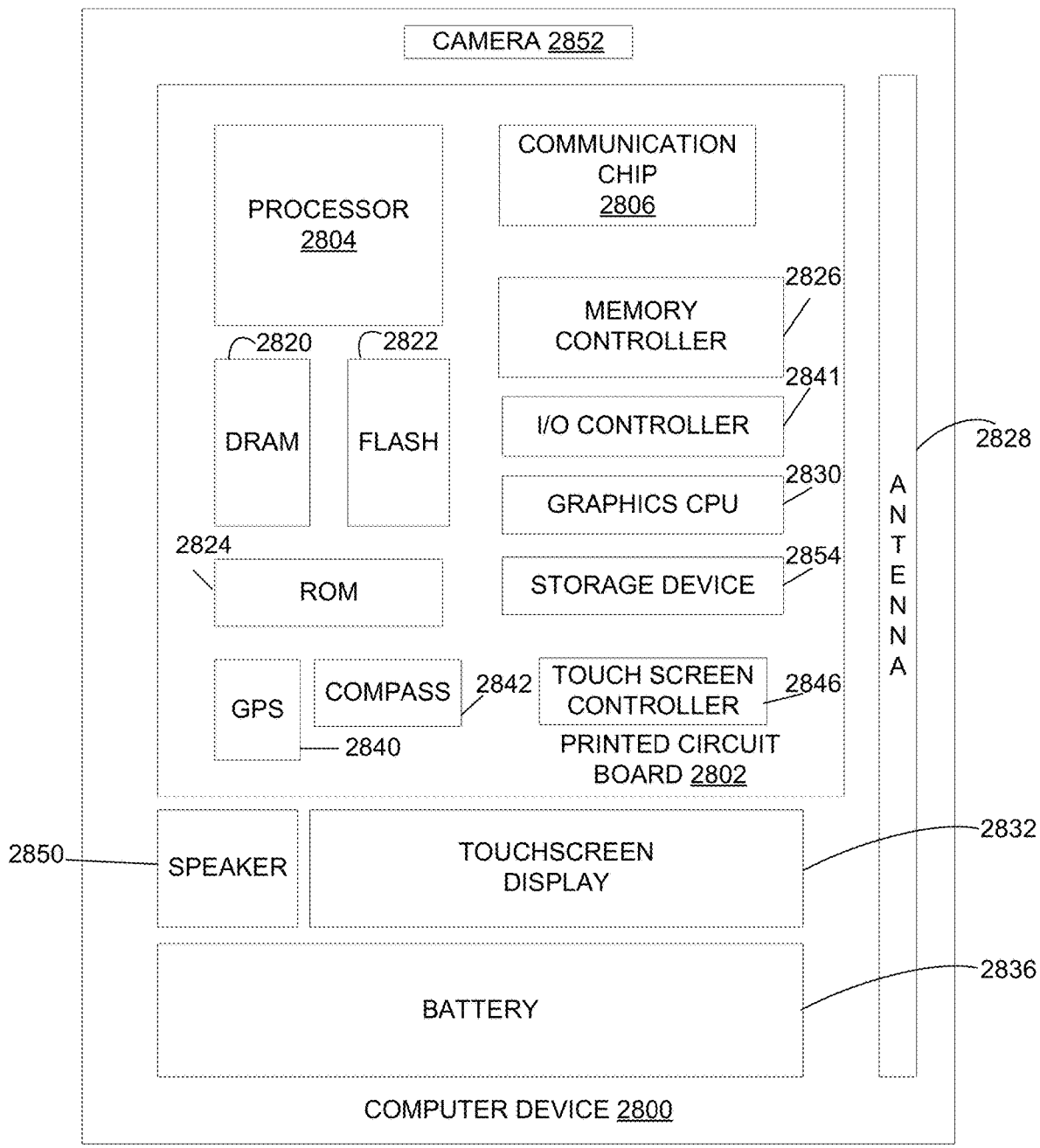
FIG. 28 illustrates an example computer device that may employ the apparatuses and/or methods described herein.

FIG. 28 illustrates an example computer device 2800 that may employ the apparatuses and/or methods described herein (e.g., the substrate 100, the procedure 200, the procedure 900, the procedure 1800), in accordance with various embodiments. As shown, computer device 2800 may include a number of components, such as one or more processor(s) 2804 (one shown) and at least one communication chip 2806. In various embodiments, the one or more processor(s) 2804 each may include one or more processor cores. In various embodiments, the at least one communication chip 2806 may be physically and electrically coupled to the one or more processor(s) 2804. In further implementations, the communication chip 2806 may be part of the one or more processor(s) 2804. In various embodiments, computer device 2800 may include printed circuit board (PCB) 2802. For these embodiments, the one or more processor(s) 2804 and communication chip 2806 may be disposed thereon. In alternate embodiments, the various components may be coupled without the employment of PCB 2802.

Depending on its applications, computer device 2800 may include other components that may or may not be physically and electrically coupled to the PCB 2802. These other components include, but are not limited to, memory controller 2826, volatile memory (e.g., dynamic random access memory (DRAM) 2820), non-volatile memory such as read only memory (ROM) 2824, flash memory 2822, storage device 2854 (e.g., a hard-disk drive (HDD)), an input/output (I/O) controller 2841, a digital signal processor (not shown), a crypto processor (not shown), a graphics processor 2830, one or more antenna 2828, a display (not shown), a touch screen display 2832, a touch screen controller 2846, a battery 2836, an audio codec (not shown), a video codec (not shown), a global positioning system (GPS) device 2840, a compass 2842, an accelerometer (not shown), a gyroscope (not shown), a speaker 2850, a camera 2852, and a mass storage device (such as hard disk drive, a solid state drive, compact disk (CD), digital versatile disk (DVD)) (not shown), and so forth.

In some embodiments, the one or more processor(s) 2804, flash memory 2822, and/or storage device 2854 may include associated firmware (not shown) storing programming instructions configured to enable computer device 2800, in response to execution of the programming instructions by one or more processor(s) 2804, to practice all or selected aspects of the methods described herein. In various embodiments, these aspects may additionally or alternatively be implemented using hardware separate from the one or more processor(s) 2804, flash memory 2822, or storage device 2854.

In various embodiments, one or more components of the computer device 2800 may include a substrate that includes one or more of the features of the substrate 100 (FIG. 1). Further, the substrate of the one or more components may have been formed by utilizing the procedure 900 (FIG. 9), the procedure 1800 (FIG. 18), or some combination thereof. For example, a substrate that includes one or more of the features of the substrate 100 may be implemented within the processor 2804, the communication chip 2806, the DRAM 2820, the flash memory 2822, the ROM 2824, the GPS 2840, the compass 2842, the memory controller 2826, the I/O controller 2841, the graphics CPU 2830, the storage device 2854, the touch screen controller 2846, the PCB 2802, or some combination thereof.

The communication chips 2806 may enable wired and/or wireless communications for the transfer of data to and from the computer device 2800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2806 may implement any of a number of wireless standards or protocols, including but not limited to IEEE 802.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computer device 2800 may include a plurality of communication chips 2806. For instance, a first communication chip 2806 may be dedicated to shorter range wireless communications such as Wi-Fi and Bluetooth, and a second communication chip 2806 may be dedicated to longer range wireless communications such as GPS, EDGE, GPRS, CDMA, WiMAX, LTE, Ev-DO, and others.

In various implementations, the computer device 2800 may be a laptop, a netbook, a notebook, an ultrabook, a smartphone, a computer tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computer device 2800 may be any other electronic device that processes data.

Example 1 may include a substrate, comprising a first layer, wherein a trench is located in the first layer, a second layer located on a surface of the first layer, a first conductive element located in a first portion of the second layer adjacent to the trench, wherein the first conductive element extends to fill the trench, and a second conductive element located in a second portion of the second layer, wherein the second conductive element is located on the surface of the first layer.

Example 2 may include the substrate of example 1, wherein a thickness of the first conductive element is greater than a thickness of the second conductive element.

Example 3 may include the substrate of examples 1 or 2, wherein the first layer includes a photo-imageable dielectric material.

Example 4 may include the substrate of examples 1 or 2, wherein a distance that the first conductive element extends away from the surface of the first layer is same as a distance that the second conductive element extends away from the surface of the first layer.

Example 5 may include the substrate of examples 1 or 2, wherein the surface of the first layer is a first surface, wherein a third layer is located on a second surface of the first layer, the second surface being opposite to the first surface, and wherein a surface of the first conductive element at a bottom of the trench abuts the third layer.

Example 6 may include the substrate of examples 1 or 2, wherein the surface of the first layer is a first surface, and wherein the substrate further comprises a third layer located on a second surface of the first layer, the second surface being located opposite to the first surface, a pad located within the third layer, and a third conductive element located in a third portion of the second layer, wherein the third conductive element extends through the first layer and a portion of the third layer to the pad.

Example 7 may include the substrate of example 6, wherein the first layer includes a first photo-imageable dielectric material and the third layer includes a second photo-imageable dielectric material, and wherein a dose level of the first photo-imageable dielectric material is higher than a dose level of the second photo-imageable dielectric material.

Example 8 may include the substrate of example 6, wherein the first conductive element is a first trace, wherein the second conductive element is a second trace, and wherein the third conductive element is a via.

Example 9 may include the substrate of examples 1 or 2, wherein the first conductive element is a first trace, and wherein the second conductive element is a second trace.

Example 10 may include the substrate of examples 1 or 2, further comprising a dielectric material, wherein a first portion of dielectric material is located between the first conductive element and a portion of the substrate, wherein the first portion of the dielectric material has a first thickness equal to a distance between the first conductive element and the portion of the substrate, wherein a second portion of the dielectric material is located between the second conductive element and the portion of the substrate, wherein the second portion of the dielectric material has a second thickness equal to a distance between the second conductive element and the portion of the substrate, and wherein the second thickness is greater than the first thickness.

Example 11 may include the substrate of example 10, wherein the second layer is located at a first side of the substrate, and wherein the portion of the substrate is a second side of the substrate, the second side of the substrate being opposite to the first side of the substrate.

Example 12 may include a method of forming different conductor thicknesses on a layer, comprising applying light to a portion of a surface of the layer, wherein the layer includes a photo-imageable dielectric (PID) material, wherein the applying the light causes a first portion of the layer to be cured, and wherein a second portion of the layer remains uncured, removing the second portion of the layer, wherein removing the second portion of the layer forms a trench in the layer, and forming a first conductive element and a second conductive element, wherein the first conductive element fills the trench and extends above the surface of the layer, and wherein the second conductive surface is located on the surface of the layer.

Example 13 may include the method of example 12, wherein forming the first conductive element and the second conductive element includes positioning a layer-resist on the layer, wherein the layer-resist includes a first opening located over the trench and a second opening located over second portion of the surface of the layer, and performing an electroplating procedure, wherein the electroplating procedure results in the first conductive element filling the trench and extending above the surface of the layer, and in the second conductive element located on the surface of the layer at the second portion of the surface of the layer.

Example 14 may include the method of example 13, further comprising depositing a seed layer on the surface of the layer and walls of the trench prior to positioning the layer-resist on the layer, and performing a seed etch procedure to remove a portion of the seed layer that is exposed after the electroplating procedure and removal of the layer-resist.

Example 15 may include the method of example 13, wherein the layer is a first layer, wherein the surface of the layer is a first surface of the first layer, wherein a second layer is located on a second surface of the first layer, the second surface being opposite to the first surface, wherein a pad is located in the second layer, wherein the method further comprises forming a via that extends through the first layer and the second layer to the pad, and wherein the via extends above the first surface of the first layer.

Example 16 may include the method of example 15, wherein forming the via includes laser drilling through the first layer and the second layer to the pad to generate a recess for the via, and desmearing walls of the recess, wherein the layer-resist includes a third opening located over the recess, and wherein the electroplating procedure further results in the formation of the via in the recess.

Example 17 may include the method of example 16, further comprising depositing a seed layer on the first surface of the first layer, walls of the trench, and the walls of the recess prior to positioning the layer-resist on the layer, and performing a seed etch procedure to remove a portion of the seed layer that is exposed after the electroplating procedure and removal of the layer-resist.

Example 18 may include the method of any of examples 12-17, further comprising positioning a mask on the surface of the layer, wherein the light passes through an opening in the mask.

Example 19 may include the method of any of examples 12-17, wherein the layer is a first layer, wherein the surface of the layer is a first surface of the first layer, wherein the PID material is a first PID material, wherein the light is a first intensity of light, wherein a second layer is located on a second surface of the first layer, the second surface being opposite to the first surface, wherein a pad is located in the second layer, wherein the first intensity of light causes a first portion of the second layer to be cured, and wherein the method further comprises applying a second intensity of light to a second portion of the first surface of the first layer, wherein the second intensity of light causes a second portion of the second layer to be cured, and wherein a third portion of the second layer remains uncured, the third portion of the second layer being adjacent to the pad, removing the third portion of the second layer, wherein removing the third portion of the second layer forms a recess for a via, and forming the via in the recess, wherein the via extends through the first layer and the second layer to the pad, and wherein the via extends above the first surface of the first layer.

Example 20 may include the method of example 19, further comprising positioning a mask on the first surface of the first layer, wherein the first intensity of light passes through an opening in the mask, and wherein the second intensity of light passes through a transparent portion of the mask that decreased an intensity of the second intensity of light.

Example 21 may include the method of any of examples 12-17, wherein a thickness of the first conductive element is greater than a thickness of the second conductive element.

Example 22 may include the method of any of examples 12-17, wherein a distance that the first conductive element extends away from the surface of the layer is same as a distance that the second conductive element extends away from the surface of the layer.

Example 23 may include the method of any of examples 12-17, wherein the first conductive element is a first trace and the second conductive element is a second trace.

Example 24 may include a semiconductor package, comprising a die, and a substrate coupled to the die, the substrate comprising a first layer, wherein a trench is located in the first layer, a second layer located on a surface of the first layer, a first conductive element located in a first portion of the second layer adjacent to the trench, wherein the first conductive element extends to fill the trench, and a second conductive element located in a second portion of the second layer, wherein the second conductive element is located on the surface of the first layer.

Example 25 may include the semiconductor package of example 24, wherein a thickness of the first conductive element is greater than a thickness of the second conductive element.

Example 26 may include the semiconductor package of examples 24 or 25, wherein the first layer includes a photo-imageable dielectric material.

Example 27 may include the semiconductor package of examples 24 or 25, wherein a distance that the first conductive element extends away from the surface of the first layer is same as a distance that the second conductive element extends away from the surface of the first layer.

Example 28 may include the semiconductor package of examples 24 or 25, wherein the surface of the first layer is a first surface, wherein a third layer is located on a second surface of the first layer, the second surface being opposite to the first surface, and wherein a surface of the first conductive element at a bottom of the trench abuts the third layer.

Example 29 may include the semiconductor package of examples 24 or 25, wherein the surface of the first layer is a first surface, and wherein the substrate further comprises a third layer located on a second surface of the first layer, the second surface being located opposite to the first surface, a pad located within the third layer, and a third conductive element located in a third portion of the second layer, wherein the third conductive element extends through the first layer and a portion of the third layer to the pad.

Example 30 may include the semiconductor package of example 29, wherein the first layer includes a first photo-imageable dielectric material and the third layer includes a second photo-imageable dielectric material, and wherein a dose level of the first photo-imageable dielectric material is higher than a dose level of the second photo-imageable dielectric material.

Example 31 may include the semiconductor package of example 29, wherein the first conductive element is a first trace, wherein the second conductive element is a second trace, and wherein the third conductive element is a via.

Example 32 may include the semiconductor package of examples 24 or 25, wherein, the first conductive element is a first trace, and wherein the second conductive element is a second trace.

Example 33 may include the semiconductor package of examples 24 or 25, wherein the substrate further comprises dielectric material, wherein a first portion of dielectric material is located between the first conductive element and a portion of the substrate, wherein the first portion of the dielectric material has a first thickness equal to a distance between the first conductive element and the portion of the substrate, wherein a second portion of the dielectric material is located between the second conductive element and the portion of the substrate, wherein the second portion of the dielectric material has a second thickness equal to a distance between the second conductive element and the portion of the substrate, and wherein the second thickness is greater than the first thickness.

Example 34 may include the semiconductor package of example 33, wherein the second layer is located at a first side of the substrate, and wherein the portion of the substrate is a second side of the substrate, the second side of the substrate being opposite to the first side of the substrate.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:
1. A substrate, comprising:
a conductive pad having a top surface and side surfaces;
a first insulator layer having a first portion on the top surface of the conductive pad and a second portion along the side surfaces of the conductive pad, the first portion of the first insulator layer continuous with and having a same composition as the second portion of the first insulator layer, wherein a trench is located in the first insulator layer, the trench exposing a portion of the top surface of the conductive pad;
a second insulator layer located on a surface of the first insulator layer, the second insulator layer having a top surface;
a first conductive element located in a first portion of the second insulator layer adjacent to the trench, wherein the first conductive element extends to fill the trench and contacts the portion of the top surface of the conductive pad exposed by the trench, and wherein the first conductive element extends laterally over a first portion of the top surface of the second insulator layer, the first conductive element having an uppermost surface and a bottommost surface in a cross-sectional view;
a second conductive element located in a second portion of the second insulator layer, wherein the second conductive element is located directly on the surface of the first insulator layer, and wherein the second conductive element extends laterally over a second portion of the top surface of the second insulator layer, the second conductive element having an uppermost surface and a bottommost surface in the cross-sectional view, the uppermost surface of the second conductive element at a same level as the uppermost surface of the first conductive element, and the bottommost surface of the second conductive element above the bottommost surface of the first conductive element; and
a third conductive element located on a third portion of the top surface of the second insulator layer, wherein the third conductive element does not extend into the second insulator layer, the third conductive element having an uppermost surface and a bottommost surface in the cross-sectional view, the uppermost surface of the third conductive element at a same level as the uppermost surface of the second conductive element, and the bottommost surface of the third conductive element above the bottommost surface of the second conductive element;
wherein a distance that the first conductive element extends away from the surface of the first insulator layer is same as a distance that the second conductive element extends away from the surface of the first insulator layer; and
wherein the surface of the first insulator layer is a first surface, wherein a third layer is located on a second surface of the first insulator layer, the second surface being opposite to the first surface, and wherein a surface of the first conductive element at a bottom of the trench abuts the third layer.

2. The substrate of claim 1, wherein a thickness of the first conductive element is greater than a thickness of the second conductive element.

3. The substrate of claim 1, wherein the first insulator layer includes a photo-imageable insulator material.

4. The substrate of claim 1, wherein the first conductive element is a first trace, and wherein the second conductive element is a second trace.

5. A semiconductor package, comprising:
a die; and
a substrate coupled to the die, the substrate comprising:
a conductive pad having a top surface and side surfaces;
a first insulator layer having a first portion on the top surface of the conductive pad and a second portion along the side surfaces of the conductive pad, the first portion of the first insulator layer continuous with and having a same composition as the second portion of the first insulator layer, wherein a trench is located in the first insulator layer, the trench exposing a portion of the top surface of the conductive pad;
a second insulator layer located on a surface of the first insulator layer, the second insulator layer having a top surface; a first conductive element located in a first portion of the second insulator layer adjacent to the trench, wherein the first conductive element extends to fill the trench and contacts the portion of the top surface of the conductive pad exposed by the trench, and wherein the first conductive element extends laterally over a first portion of the top surface of the second insulator layer, the first conductive element having an uppermost surface and a bottommost surface in a cross-sectional view;
a second conductive element located in a second portion of the second insulator layer, wherein the second conductive element is located directly on the surface of the first insulator layer, and wherein the second conductive element extends laterally over a second portion of the top surface of the second insulator layer, the second conductive element having an uppermost surface and a bottommost surface in the cross-sectional view, the uppermost surface of the second conductive element at a same level as the uppermost surface of the first conductive element, and the bottommost surface of the second conductive element above the bottommost surface of the first conductive element; and
a third conductive element located on a third portion of the top surface of the second insulator layer, wherein the third conductive element does not extend into the second insulator layer, the third conductive element having an uppermost surface and a bottommost surface in the cross-sectional view, the uppermost surface of the third conductive element at a same level as the uppermost surface of the second conductive element, and the bottommost surface of the third conductive element above the bottommost surface of the second conductive element;
wherein a distance that the first conductive element extends away from the surface of the first insulator layer is same as a distance that the second conductive element extends away from the surface of the first insulator layer; and
wherein the surface of the first insulator layer is a first surface, wherein a third layer is located on a second surface of the first insulator layer, the second surface being opposite to the first surface, and wherein a surface of the first conductive element at a bottom of the trench abuts the third layer.

6. The semiconductor package of claim 5, wherein a thickness of the first conductive element is greater than a thickness of the second conductive element.

7. The semiconductor package of claim 5, wherein the first insulator layer includes a photo-imageable insulator material.

* * * * *